US012057412B2

(12) United States Patent
Wu et al.

(10) Patent No.: US 12,057,412 B2
(45) Date of Patent: Aug. 6, 2024

(54) DEVICE CRACK-STOP STRUCTURE TO PREVENT DAMAGE DUE TO DICING CRACK

(71) Applicant: Taiwan Semiconductor Manufacturing Company, Ltd., Hsin-Chu (TW)

(72) Inventors: Tung-Ting Wu, Taipei (TW); Chen-Jong Wang, Hsin-Chu (TW); Jen-Cheng Liu, Hsin-Chu (TW); Yimin Huang, Hsinchu (TW); Chin-Chia Kuo, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/725,890

(22) Filed: Apr. 21, 2022

(65) Prior Publication Data
US 2022/0246549 A1    Aug. 4, 2022

Related U.S. Application Data

(62) Division of application No. 16/589,460, filed on Oct. 1, 2019, now Pat. No. 11,348,881.

(51) Int. Cl.
*H01L 23/58*    (2006.01)
*H01L 27/146*    (2006.01)

(52) U.S. Cl.
CPC ........ *H01L 23/585* (2013.01); *H01L 27/1463* (2013.01); *H01L 27/14634* (2013.01); *H01L 27/14636* (2013.01); *H01L 27/1464* (2013.01); *H01L 27/14685* (2013.01)

(58) Field of Classification Search
CPC .................................................... H01L 23/585
See application file for complete search history.

(56) References Cited

U.S. PATENT DOCUMENTS

| 9,711,463 | B2 | 7/2017 | Lin et al. | |
| 10,043,841 | B1 * | 8/2018 | Chang | ............... H01L 21/31053 |
| 2006/0055002 | A1 | 3/2006 | Yao et al. | |
| 2007/0102791 | A1 | 5/2007 | Wu | |
| 2007/0102792 | A1 | 5/2007 | Wu | |
| 2009/0115024 | A1 | 5/2009 | Jeng et al. | |
| 2010/0123219 | A1 | 5/2010 | Chen et al. | |

(Continued)

OTHER PUBLICATIONS

Non-Final Office Action dated Jul. 22, 2021 for U.S. Appl. No. 16/589,460.

(Continued)

*Primary Examiner* — Peter Bradford
(74) *Attorney, Agent, or Firm* — Eschweiler & Potashnik, LLC

(57) ABSTRACT

Various embodiments of the present disclosure are directed towards a method for forming a semiconductor device, the method including forming a plurality of photodetectors in a substrate. A device isolation structure is formed within the substrate. The device isolation structure laterally wraps around the plurality of photodetectors. An outer isolation structure is formed within the substrate. The device isolation structure is spaced between sidewalls of the outer isolation structure. The device isolation structure and the outer isolation structure comprise a dielectric material.

20 Claims, 21 Drawing Sheets

(56) References Cited

U.S. PATENT DOCUMENTS

| | | | |
|---|---|---|---|
| 2011/0127631 A1 | 6/2011 | Kawashima | |
| 2011/0186917 A1* | 8/2011 | Akiyama | H01L 27/14636 |
| | | | 257/292 |
| 2012/0175722 A1 | 7/2012 | Tai et al. | |
| 2014/0027928 A1* | 1/2014 | Watanabe | H01L 23/562 |
| | | | 257/774 |
| 2014/0124889 A1 | 5/2014 | Qian et al. | |
| 2014/0154864 A1* | 6/2014 | Huang | H01L 21/76224 |
| | | | 438/424 |
| 2014/0239455 A1* | 8/2014 | Ishii | H01L 23/562 |
| | | | 257/622 |
| 2016/0043120 A1* | 2/2016 | Ahn | H01L 27/14614 |
| | | | 257/229 |
| 2016/0204074 A1* | 7/2016 | Lin | H01L 21/784 |
| | | | 257/76 |
| 2017/0271383 A1* | 9/2017 | Lai | H01L 27/14654 |
| 2019/0067357 A1* | 2/2019 | Cheng | H01L 27/14621 |
| 2020/0343280 A1* | 10/2020 | Ishino | H01L 27/1469 |
| 2020/0395296 A1 | 12/2020 | Lu | |

OTHER PUBLICATIONS

Notice of Allowance dated Jan. 27, 2022 for U.S. Appl. No. 16/589,460.

* cited by examiner

DEVICE CRACK-STOP STRUCTURE TO PREVENT DAMAGE DUE TO DICING CRACK

REFERENCE TO RELATED APPLICATION

This application is a Divisional of U.S. application Ser. No. 16/589,460, filed on Oct. 1, 2019, the contents of which are hereby incorporated by reference in their entirety.

BACKGROUND

Integrated circuits (ICs) with image sensors are used in a wide range of modern day electronic devices, such as cameras and cell phones, for example. Complementary metal-oxide semiconductor (CMOS) devices have become popular IC image sensors. Compared to charge-coupled devices (CCD), CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

An IC containing an image sensor is generally formed from a semiconductor wafer. The semiconductor wafer has a plurality of ICs arranged in rows and columns. The semiconductor wafer is sawn or "diced" into discrete ICs along two mutually perpendicular sets of parallel lines or "streets" lying between each of the rows and columns thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
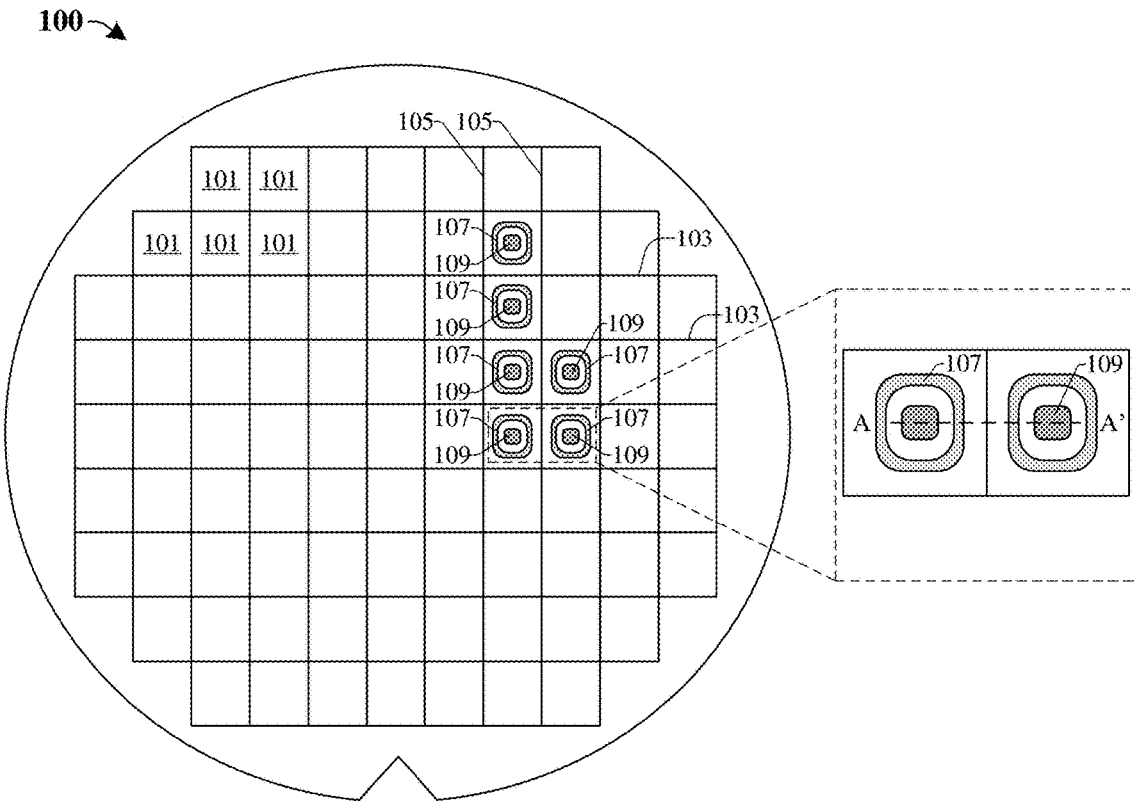
FIGS. 1A-1C illustrate various views of some embodiments of a semiconductor wafer having multiple dies.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multiple complementary metal-oxide-semiconductor (CMOS) devices containing integrated circuits may be fabricated together on a semiconductor wafer. The semiconductor wafer includes multiple dies with specified areas for an integrated chip. Further, the semiconductor wafer may include an interconnect structure disposed along a surface of a semiconductor substrate. Each integrated chip includes a device region surrounded by a peripheral region, where the device region comprises one or more semiconductor devices (e.g., transistors, photodetectors, etc.). A scribe line or a scribe street exists between the peripheral regions of each integrated chip. During a cutting process of the semiconductor wafer along the scribe lines, die saw induced damage can cause a crack in the semiconductor wafer. This die saw induced damage can propagate to the device region of the die, thereby rendering the semiconductor devices damaged and/or inoperable and reducing a yield of the fabrication process.

A number of solutions may be implemented to reduce the damage induced by the die saw. For example, a lateral distance between adjacent dies may be increased, thereby mitigating a chance of the die saw induced damage propagating through the semiconductor wafer to the device region. This in turn reduces a number of integrated chips that may be disposed on the semiconductor wafer. Further, seal rings may be disposed within the interconnect structure extending along an upper and/or lower surface of the semiconductor substrate. The seal ring may laterally surround the device region of each die. The seal ring may prevent damage to structure(s) and/or layer(s) disposed within the interconnect structure, however the die saw induced damage may still propagate through the interconnect structure to the semiconductor substrate and cause damage to the semiconductor devices disposed within the device region of each integrated chip.

Accordingly, in some embodiments, the present disclosure relates to a crack-stop structure disposed within a semiconductor substrate and laterally surrounding a device region of an integrated chip. For example, a plurality of integrated chips are formed within a semiconductor wafer. The semiconductor wafer includes an interconnect structure disposed along a surface of a semiconductor substrate. Each integrated chip has a device region, comprising one or more semiconductor devices, laterally surrounded by a peripheral region. Crack-stop structures are disposed within the semiconductor substrate and respectively continuous wrap around the device region of a corresponding integrated chip. Scribe lines are disposed between each crack-stop structure. During a cutting process of the semiconductor wafer along the scribe lines, die saw induced damage can cause a crack in the semiconductor wafer. The die saw induced damage can propagate to the semiconductor substrate. However, by disposing the crack-stop structure within the semiconductor substrate and laterally around the device region, it is able to prevent and/or stop the die saw induced damage from reaching the one or more semiconductor devices. This in turn prevents the one or more semiconductor devices from being damaged and increases a process yield of the fabrication process utilized to singulate the integrated chips from the semiconductor wafer.

FIG. 1A illustrates some embodiments of a top view of a semiconductor wafer 100 having a plurality of individual dies 101 laterally adjacent to one another. FIG. 1A illustrates some embodiments of a top view of the semiconductor wafer 100 taken along line A-A' of FIG. 1B.

In some embodiments, each individual die 101 has a device region 109. The device region 109 may include one or more semiconductor devices (e.g., transistors, photodetectors, etc.) disposed within and/or on a semiconductor substrate. A crack-stop structure 107 continuously wraps around an outer perimeter of the device region 109, where the device region 109 is spaced laterally between an inner perimeter of the crack-stop structure 107. In some embodiments, during fabrication the individual dies 101 are separated from one another by "dicing" the semiconductor wafer along orthogonal scribe lines (or saw "streets") 103, 105 using a singulation process. In some embodiments, the singulation process includes using a saw blade and/or a cutting laser to cut completely through the scribe lines. In such embodiments, cutting induced damage, such as a crack, may occur in the semiconductor wafer 100. The crack-stop structure 107 is arranged between the scribe lines 103, 105 and a corresponding device region 109, such that the crack-stop structure 107 may impede and/or stop the cutting induced damage from reaching the device region 109. This in turn prevents the one or more semiconductor devices from being damaged and increases a process yield of the fabrication process utilized to singulate the individual dies 101.

Figure 1B:
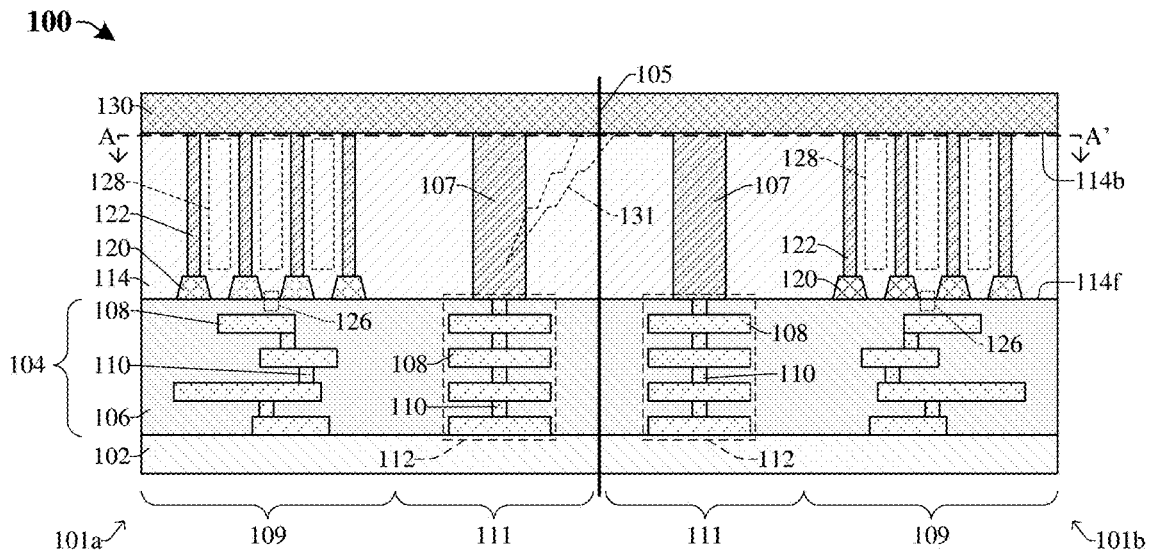

FIG. 1B illustrates a cross-sectional view of some embodiments of the semiconductor wafer 100 of FIG. 1A taken along line A-A'.

As illustrated in FIG. 1B, the semiconductor wafer 100 includes an interconnect structure 104 overlying a semiconductor structure 102 and a semiconductor substrate 114 overlying the interconnect structure 104. In some embodiments, the semiconductor structure 102 may, for example, be configured as a support structure (e.g., a carrier substrate), or may be configured as an application specific integrated circuit (ASIC) structure with ASIC devices (not shown) electrically coupled to the interconnect structure 104. The interconnect structure 104 includes an interconnect dielectric structure 106, a plurality of conductive wires 108, and a plurality of conductive vias 110. The interconnect structure 104 is configured to electrically couple one or more semiconductor devices 126 (e.g., transistors) disposed on and/or within the semiconductor substrate 114 to other semiconductor devices (not shown) (e.g., ASIC devices within the semiconductor structure 102). Further, a plurality of photodetectors 128 may be disposed within the semiconductor substrate 114. The photodetectors 128 are configured to absorb incident radiation (e.g., photons) and generate an electrical signal corresponding to the incident radiation. The electrical signal may, for example, be transfer through the one or more semiconductor devices 126.

First isolation structures 120 extend from a front-side 114f of the semiconductor substrate 114 to a point above the front-side 114f. Second isolation structures 122 extend from the point above the front-side 114f to a back-side 114b of the semiconductor substrate 114, where the back-side 114b is opposite the front-side 114f. In some embodiments, the first and second isolation structures 120, 122 extend laterally around each photodetector 128. In some embodiments, the first and second isolation structures 120, 122 are configured to electrically isolate the photodetectors 128 from one another. Further, the first and second isolation structures 120, 122 may electrically isolate the one or more semiconductor devices 126 from one another. Additionally, an upper pixel structure 130 overlies the back-side 114b of the semiconductor substrate 114. In some embodiments, the upper pixel structure 130 may, for example, comprise an anti-reflection layer, color filters, pixel grid structures, micro-lenses, and/or the like.

Further, the semiconductor wafer 100 includes a first die 101a laterally adjacent to a second die 101b. The first and second dies 101a, 101b are laterally separated from one another by a scribe line 105 and each comprise a device region 109 laterally surrounded by a peripheral region 111. The one or more semiconductor devices 126 and/or the photodetectors 128 are arranged laterally within the device region 109. The peripheral region 111 wraps around an outer perimeter of the device region 109 and continuously surrounds the one or more semiconductor devices 126 and/or the photodetectors 128. A seal ring structure 112 is disposed laterally within the peripheral region 111 and laterally surrounds the device region 109. The seal ring structure 112 comprises one or more ring shaped structures that may be concentrically aligned with one another. In some embodiments, the seal ring structure 112 comprises conductive wires 108 and conductive vias 110. The conductive wires and vias 108, 110 that are a part of the seal ring structure 112 may have a ring shape when viewed from above, such that they continuously wrap around the device region 109. In some embodiments, the seal ring structure 112 may continuously extend from a bottom surface of the interconnect structure 104 to the front-side 114f of the semiconductor substrate 114.

The first and second dies 101a, 101b each include a crack-stop structure 107 disposed within the peripheral region 111. In some embodiments, the crack-stop structure 107 continuously extends from the front-side 114f to the back-side 114b of the semiconductor substrate 114. The crack-stop structure 107 laterally encloses the device region 109 and is configured to prevent damage to the one or more semiconductor devices 126 and/or the photodetectors 128 disposed within the semiconductor substrate 114. Thus, the crack-stop structure 107 defines a wall or a barrier protecting the device region 109 of the first and second dies 101a, 101b, respectively. For example, the crack-stop structure 107 may protect the device region 109 from a singulation process performed on the semiconductor wafer 100. In some embodiments, the singulation process may include cutting and/or breaking the semiconductor wafer 100 along the scribe line 105 with a dicing saw and/or a dicing laser. The dicing saw and/or the dicing laser may cut through an entire thickness of the semiconductor wafer 100. In further embodiments, during the singulation process, a crack 131 may form within the semiconductor wafer 100. For example, the crack 131 may extend from the back-side 114b of the semiconductor substrate 114 to a point below the back-side 114b. In some embodiments, the crack 131 may be due to mechanical strain induced upon the crystal lattice of the semiconductor substrate 114 during the singulation process. The crack 131 may extend laterally from the scribe line 105 and continuously extend to a sidewall of the crack-stop structure 107. In some embodiments (as illustrated in FIG. 1B) the crack 131 may extend into the crack-stop structure 107. However, due to a width, a material, and/or a structure of the crack-stop structure 107, the crack 131 may be stopped or impeded from reaching the device region 109. This in turn prevents damage to the one or more semiconductor devices 126, the photodetectors 128, other devices (not shown), and/or other doped regions (not shown) disposed within/on the semiconductor substrate 114. Thus, the crack-stop structure 107 may increase a structural integrity of the semiconductor wafer 100 and may increase a process yield of the fabrication process utilized to singulate the first and second IC dies 101a, 101b.

Figure 1C:
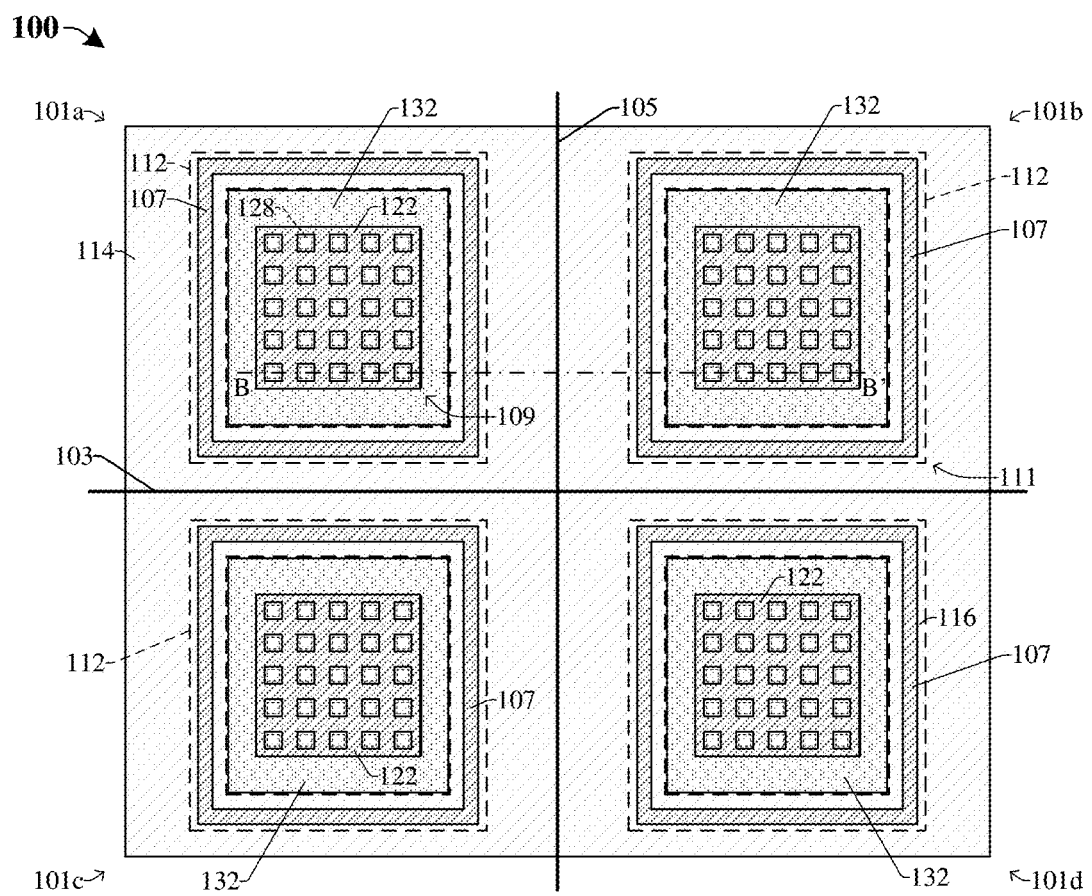

FIG. 1C illustrates a top view of some embodiments of the semiconductor wafer 100 of FIG. 1B taken along line A-A'. In further embodiments, FIG. 1B illustrates a cross-sectional view of the semiconductor wafer 100 of FIG. 1C taken along line B-B'.

As illustrated in FIG. 1C, a plurality of dies 101a-d are disposed across the semiconductor wafer 100 and are laterally adjacent to one another. The dies 101a-d are laterally separated from one another by scribe lines 105, 103. In some embodiments, a first scribe line 103 extends continuously in a first direction and a second scribe line 105 extends continuously in a second direction orthogonal to the first direction. Each die 101a-d includes a crack-stop structure 107 laterally enclosing a device region 109. The crack-stop structure 107 is vertically disposed above a seal ring structure 112. A conductive shielding structure 132 is disposed laterally between inner sidewalls of the crack-stop structure 107 and photodetectors 128 disposed within the device region 109. In some embodiments, the conductive shielding structure 132 is configured to prevent cross-talk between the photodetectors 128. The second isolation structure 122 continuously extends around each photodetector 128. Further, as illustrated in FIG. 1C, the crack-stop structure 107 and/or the seal ring structure 112 may be ring-shaped when viewed from above. In such embodiments, the ring-shape may, for example, be rectangular, triangular, circular, elliptical, or another suitable shape. In some embodiments, the seal ring structure 112 and the crack-stop structure 107 are configured to prevent damage to semiconductor devices (not shown) and/or the photodetectors disposed within the device region 109 while performing a singulation process along the first and/or second scribe lines 103, 105. This in turn may prevent and/or stop a cracking or breaking of the lattice structure of the semiconductor substrate 114, thereby increasing a process yield of the singulation process performed on the dies 101a-d.

Figure 2A:
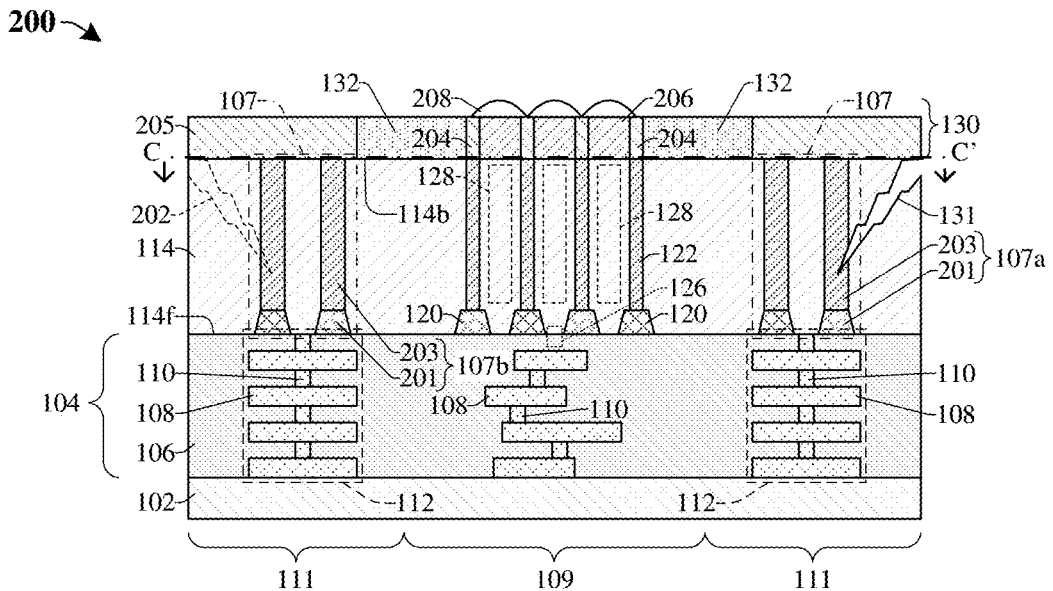
FIGS. 2A-2B illustrate various views of some embodiments of a diced substrate.

FIG. 2A illustrates a cross-sectional view of some embodiments of an integrated chip 200. In further embodiments, the integrated chip 200 may be a diced die after performing the singulation process on the semiconductor wafer 100 of FIGS. 1A-1C. In such embodiments, the integrated chip 200 may correspond to the first die 101a of FIGS. 1B-1C after performing the singulation process.

The integrated chip 200 includes an interconnect structure 104 overlying a semiconductor structure 102 and a semiconductor substrate 114 overlying the interconnect structure 104. In some embodiments, the semiconductor structure 102 may, for example, be configured as a support structure (e.g., a carrier substrate), or may be configured as an application specific integrated circuit (ASIC) structure with ASIC devices (not shown) electrically coupled to the interconnect structure 104. The interconnect structure 104 includes an interconnect dielectric structure 106, a plurality of conductive wires 108, and a plurality of conductive vias 110. The interconnect dielectric structure 106 may, for example, be or comprise one or more inter-level dielectric (ILD) layers. The one or more ILD layers may, for example, respectively be or comprise an oxide, such as silicon dioxide, a low-k dielectric material, or another suitable dielectric material. In further embodiments, the conductive wires and/or vias 108, 110 may, for example, respectively be or comprise copper, aluminum, tungsten, titanium, a combination of the foregoing, or the like.

The semiconductor substrate 114 may, for example, be or comprise a bulk substrate (e.g., a bulk silicon substrate), a silicon-on-insulator (SOI) substrate, a silicon germanium (SiGe) substrate, or some other suitable substrate comprising a first doping type (e.g., p-type doping). In some embodiments, a plurality of photodetectors 128 are disposed within the semiconductor substrate 114 and may respectively comprise a second doping type (e.g., n-type doping) opposite the first doping type. One or more semiconductor devices 126 are disposed on and/or within the semiconductor substrate 114. The one or more semiconductor devices 126 may, for example, be or comprise pixel devices (e.g., transfer transistors, rest transistors, source-follower transistors, etc.) configured to transfer captured charge from the photodetectors 128 to the interconnect structure 104. A first isolation structure 120 and a second isolation structure 122 laterally surround each photodetector 128. In some embodiments, the first isolation structure 120 may, for example, be configured as a shallow trench isolation (STI) structure. In further embodiments, the second isolation structure 122 may, for example, be configured as a deep trench isolation (DTI) structure. In some embodiments, the first isolation structure 120 may, for example, be or comprise silicon oxide, silicon nitride, another suitable dielectric material, or the like. In further embodiments, the second isolation structure 122 may, for example, be or comprise an oxide, such as silicon dioxide, silicon nitride, silicon carbide, hafnium oxide, aluminum oxide, a conductive material, or the like. In yet further embodiments, the first isolation structure 120 may comprise a first material and the second isolation structure 122 may comprise a second material different from the first material.

An upper pixel structure 130 overlies the semiconductor substrate 114 and includes an upper dielectric structure 205, a conductive shielding structure 132, a grid structure 204, a plurality of color filters 206, and/or a plurality of microlenses 208. The conductive shielding structure 132 may be configured to prevent cross-talk between the photodetectors 128. In some embodiments, the grid structure 204 may, for example, be or comprise a dielectric grid structure, a metal grid structure, a combination of the foregoing, or the like. For example, the grid structure 204 may be or comprise a dielectric grid structure configured to achieve total internal reflection (TIR) with the adjacent color filters 206. Further, the color filters 206 overlie the back-side 114b of the semiconductor substrate 114 and are respectively configured to pass a first range of wavelengths while blocking a second range of wavelengths different from the first range. A plurality of micro-lenses are disposed over the color filters 206. The micro-lenses are configured to focus incident radiation towards the photodetectors 128.

A crack-stop structure 107 continuously laterally surrounds the device region 109. The crack-stop structure 107 may comprise one or more structures that each laterally surround the device region 109. For example, the crack-stop structure 107 may comprise an outer crack-stop structure 107a and an inner crack-stop structure 107b. The inner crack-stop structure 107b is spaced laterally between inner sidewalls of the outer crack-stop structure 107a, where the outer crack-stop structure 107a laterally encloses the inner crack-stop structure 107b. In some embodiments, the outer crack-stop structure 107a is concentric with the inner crack-stop structure 107b. Further, the inner and outer crack-stop structures 107a, 107b may respectively include a first crack-stop segment 201 and a second crack-stop segment 203. In some embodiments, the first and/or second crack-stop segments 201, 203 may, for example, respectively be or comprise air, an oxide, such as silicon dioxide, silicon nitride, silicon carbide, hafnium oxide, aluminum oxide, a metal material, such as copper, aluminum, a combination of the foregoing, or the like. In some embodiments, the first crack-stop segment 201 may comprise a third material and the second crack-stop segment 203 may comprise a fourth material different from the third material. For example, the third material may comprise a dielectric material and the fourth material comprise a metal material. Further, the first crack-stop segment 201 and/or the second crack-stop segment 203 may be or comprise air, such that an opening exists in place of the inner and outer crack-stop structures 107a, 107b (not shown). Furthermore, the crack-stop structure 107 comprises a different material than the semiconductor substrate 114, such that when saw or laser induced damage causes a break or crack in the crystal lattice of the semiconductor substrate 114 the break or crack may not extend through the crack-stop structure 107 to the device region 109.

As illustrated in FIG. 2A, a first crack 131 may extend from the back-side 114b of the semiconductor substrate 114 to a sidewall of the outer crack-stop structure 107a. In some embodiments, the crack 131 extends into the outer crack-stop structure 107a. Further, the first crack 131 may be a void and/or opening located in the semiconductor substrate 114 due to a singulation process performed on the integrated chip 200. The singulation process included singulating the integrated chip 200 from the semiconductor wafer 100 of FIGS. 1A-1C. The crack 131 may occur from damage induced by a saw blade and/or a laser used during the singulation process. In further embodiments, a second crack 202 may extend from the back-side 114b of the semiconductor substrate 114 to another sidewall of the outer crack-stop structure 107a. In such embodiments, the first crack 131 is on a first side of the crack-stop structure 107 and the second crack 202 is on a second side of the crack-stop structure 107 opposite the first side. In yet further embodiments, the first or second cracks 131, 202 may extend through an entire width of the outer crack-stop structure 107a, through the semiconductor substrate 114 disposed between the outer and inner crack-stop structures 107a, 107b, to a sidewall of the inner crack-stop structure 107b (not shown). In such embodiments, the first or second cracks 131, 202 may stop at the inner crack-stop structure 107b and may not extend into the device region 109. Thus, in some embodiments, because the crack-stop structure 107 laterally encloses the device region 109 and comprises a material different from the semiconductor substrate 114, saw and/or laser induced damage may not reach active devices disposed in the device region 109. In yet further embodiments, the first and the second cracks 131, 202 are omitted (not shown).

Figure 2B:
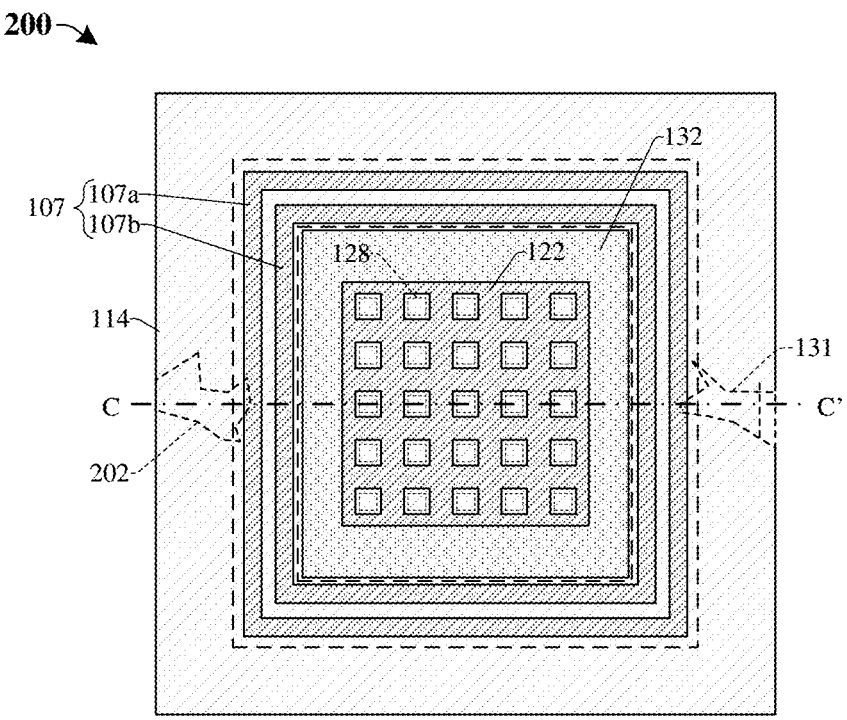

FIG. 2B illustrates a top view of some embodiments of the integrated chip 200 of FIG. 2A taken along line C-C'. In some embodiments, FIG. 2A illustrates a cross-sectional view of the integrated chip 200 of FIG. 2B taken along line C-C'.

The outer crack-stop structure 107a laterally wraps around the inner crack-stop structure 107b. In some embodiments, when viewed from above, the outer and/or inner crack-stop structures 107a, 107b may, for example, respectively have a rectangular ring-shape, a circular ring-shape, an elliptical ring-shape, or another suitable shape. Thus, the crack-stop structure 107 laterally encloses the photodetectors 128, wherein the crack-stop structure 107 prevents and/or mitigates the first and/or second cracks 131, 202 from reaching the photodetectors 128. This in turn increases a performance, an endurance, and/or a reliability of the integrated chip 200.

Figure 3A:
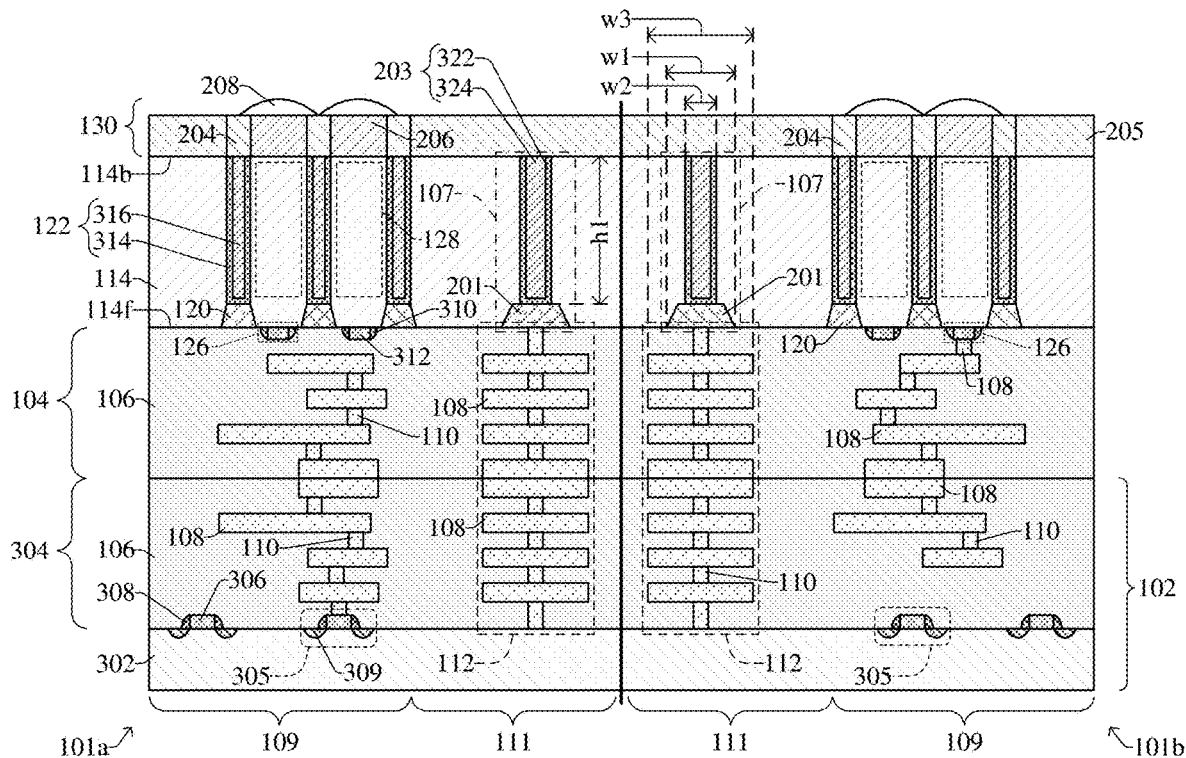
FIGS. 3A-3D illustrate various cross-sectional views of alternative embodiments of a semiconductor wafer having crack-stop structures that extend from a back-side of a semiconductor substrate to a point below the back-side of the semiconductor substrate.

FIG. 3A illustrates a cross-sectional view of a semiconductor wafer 300a according to some alternative embodiments of the semiconductor wafer 100 of FIGS. 1A-1C.

In some embodiments, the semiconductor structure 102 is configured as an application specific integrated circuit (ASIC) structure bonded to the interconnect structure 104. In further embodiments, the semiconductor structure 102 includes an ASIC interconnect structure 304 overlying an ASIC substrate 302. In some embodiments, the interconnect structure 104 and the ASIC interconnect structure 304 contact one another at a bond interface. In some embodiments, the ASIC substrate 302 may, for example, be or comprise a monocrystalline silicon substrate, a bulk silicon substrate, silicon-germanium (SiGe), a silicon-on-insulator (SOI) substrate, another suitable substrate, or the like. One or more logic devices 305 may be disposed within and/or on the ASIC substrate 302. The one or more logic devices 305 may, for example, be configured as transistors. In such embodiments, the logic devices 305 may comprise source/drain regions 309, a sidewall spacer structure 308, and a gate structure 306. Further, one or more logic devices 305 may be electrically coupled to the interconnect structure 104 by way of the ASIC interconnect structure 304. In some embodiments, the ASIC interconnect structure 304 includes an interconnect dielectric structure 106, a plurality of conductive wires 108, and/or a plurality of conductive vias 110.

In some embodiments, the semiconductor wafer 300a includes a first die 101a laterally adjacent to a second die 101b, the first and second dies 101a, 101b are separated from one another by a scribe line 105. The first and second dies 101a, 101b each include a device region 109 laterally enclosed by a peripheral region 111. In some embodiments, the one or more logic devices 305, the one or more semiconductor devices 126, and the photodetectors 128 are laterally spaced within the device region 109. In some embodiments, the one or more semiconductor devices 126 may comprise a gate structure 312 disposed along the front-side 114f of the semiconductor substrate 114 and a sidewall spacer structure 310 disposed around sidewalls of the gate structure 312. The first and second dies 101a, 101b each include a seal ring structure 112 that extends from an upper surface of the ASIC substrate 302 to the front-side 114f of the semiconductor substrate 114. The seal ring structure 112 extends continuously through the ASIC interconnect structure 304 and the interconnect structure 104. The seal ring structure 112 continuously wraps around the device region 109. Further, the first and second dies 101a each include a first isolation structure 120 and a second isolation structure 122. The first and second isolation structures 120, 122 are configured to electrically isolate the one or more semiconductor devices 126 and/or the photodetectors 128 from one another. In some embodiments, the second isolation structure 122 extends from an upper surface of the first isolation structure 120 to the back-side 114b of the semiconductor substrate 114. In further embodiments, the second isolation structure 122 may include a first isolation layer 314 and a second isolation layer 316. The first isolation layer 314 may continuously wrap around the second isolation layer 316. In some embodiments, the first isolation layer 314 may, for example, be or comprise silicon nitride, silicon carbide, a metal oxide, such as hafnium oxide, aluminum oxide, a combination of the foregoing, or the like. Further, the second isolation layer 316 may, for example, be or comprise silicon dioxide, silicon nitride, silicon carbide, a metal oxide, a metal, such as aluminum, copper, tungsten, titanium, a combination of the foregoing, or the like. In some embodiments, the first isolation layer 314 may comprise a material different from the second isolation layer 316.

In some embodiments, the crack-stop structures 107 continuous wrap around a corresponding device region 109 and respectively include a first crack-stop segment 201 and a second crack-stop segment 203 overlying the first crack-stop segment 201. In further embodiments, the first crack-stop segment 201 may, for example, be a shallow trench isolation (STI) structure and/or may comprise a same material and/or shape as the first isolation structure 120. In yet further embodiments, the second crack-stop segment 203 may, for example, be a deep trench isolation (DTI) structure and/or may comprise a same material and/or shape as the second isolation structure 122. In some embodiments, the second crack-stop segment 203 may include a first crack-stop layer 322 and a second crack-stop layer 324. In some embodiments, the first crack-stop layer 322 may be configured as a passivation layer and/or may, for example, be or comprise silicon nitride, silicon carbide, a metal oxide, such as hafnium oxide, aluminum oxide, a combination of the foregoing, or the like. In further embodiments, the second crack-stop layer 324 may, for example, be or comprise silicon oxide, air, a metal oxide, a metal, such as copper, aluminum, titanium, a combination of the foregoing, or the like. In yet further embodiments, the first crack-stop layer 322 may be or comprise a material different from the second crack-stop layer 324. In some embodiments, the first isolation layer 314 may be or comprise a same material as the first crack-stop layer 322 and/or the second isolation layer 316 may be or comprise a same material as the second crack-stop layer 324. In some embodiments, the first crack-stop segment 201 extends from the front-side 114f of the semiconductor substrate 114 to a point above the front-side 114f and the second crack-stop segment 203 extends from the point to the back-side 114b of the semiconductor substrate 114.

In some embodiments, the first crack-stop segment 201 has a first width w1 within a range of about 0.3 to 15 micrometers. In further embodiments, the second crack-stop segment 203 has a second width w2 within a range of about 0.1 to 10 micrometers. In yet further embodiments, the second crack-stop segment 203 has a height h1 within a range of about 1 to 10 micrometers. In some embodiments, if the first width w1 is less than 0.3 micrometers, the second width w2 is less than 0.1, and/or the height h1 is less than 1 micrometers, then the crack-stop structure 107 may not be able to prevent and/or impede a crack due to, for example, a singulation process from reaching the device region 109. In further embodiments, if the first width w1 is greater than 15 micrometers, the second width w2 is greater than 10 micrometers, and/or the height h1 is greater than 10 micrometers, then a number of photodetectors 128 and/or semiconductor devices 126 that may be disposed upon and/or within the semiconductor substrate 114 may be reduced. In some embodiments, the first width w1 is at least two times greater than the second width w2. The seal ring structure 112 has a third width w3. In some embodiments, the second width w2 is greater than the third width w3 (not shown), such that outer sidewalls of the seal ring structure 112 are spaced laterally between outer sidewalls of the first crack-stop segment 201 (not shown). In further embodiments, the first crack-stop segment 201, the second crack-stop segment 203, and/or the seal ring structure 112 are concentric with one another. In yet further embodiments, the first and second crack-stop segments 201, 203 are concentric with one another, while a center of the seal ring structure 112 is laterally offset from a center of the crack-stop structure 107 (not shown).

As illustrated in FIG. 3A, the crack-stop structure 107 continuously extends from the front-side 114f of the semiconductor substrate 114 to the back-side 114b of the semiconductor substrate 114. In some embodiments, during a singulation process performed along the scribe line 105, the crack-stop structure 107 may impede and/or prevent a crack due to saw and/or laser induced damage (e.g., from the singulation process) from reaching the device region 109.

Figure 3B:
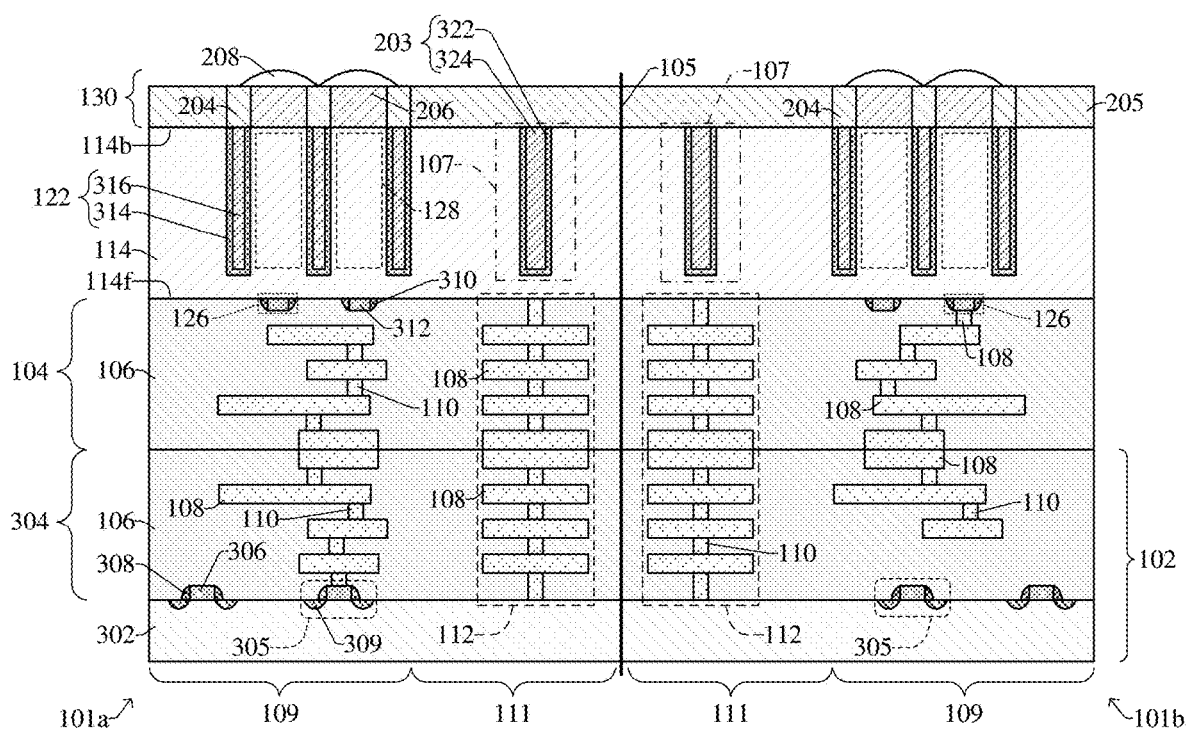

FIG. 3B illustrates a cross-sectional view of a semiconductor wafer 300b according to some alternative embodiments of the semiconductor wafer 300a of FIG. 3A, in which the first isolation structures (120 of FIG. 3A) and the first crack-stop segment (201 of FIG. 3A) are omitted.

In some embodiments, the crack-stop structures 107 each include the second crack-stop segment 203 extending from the back-side 114b of the semiconductor substrate 114 to a point below the back-side 114b. In further embodiments, the second crack-stop segment 203 includes the first crack-stop layer 322 and the second crack stop layer 324. In yet further embodiments, a lower surface of the crack-stop structures 107 may be disposed vertically below the photodetectors 128. In some embodiments, by omitting the first isolation structures (120 of FIG. 3A) and the first crack-stop segments (201 of FIG. 3A) a time and costs associated with fabricating the semiconductor wafer 300b may be reduced.

Figure 3C:
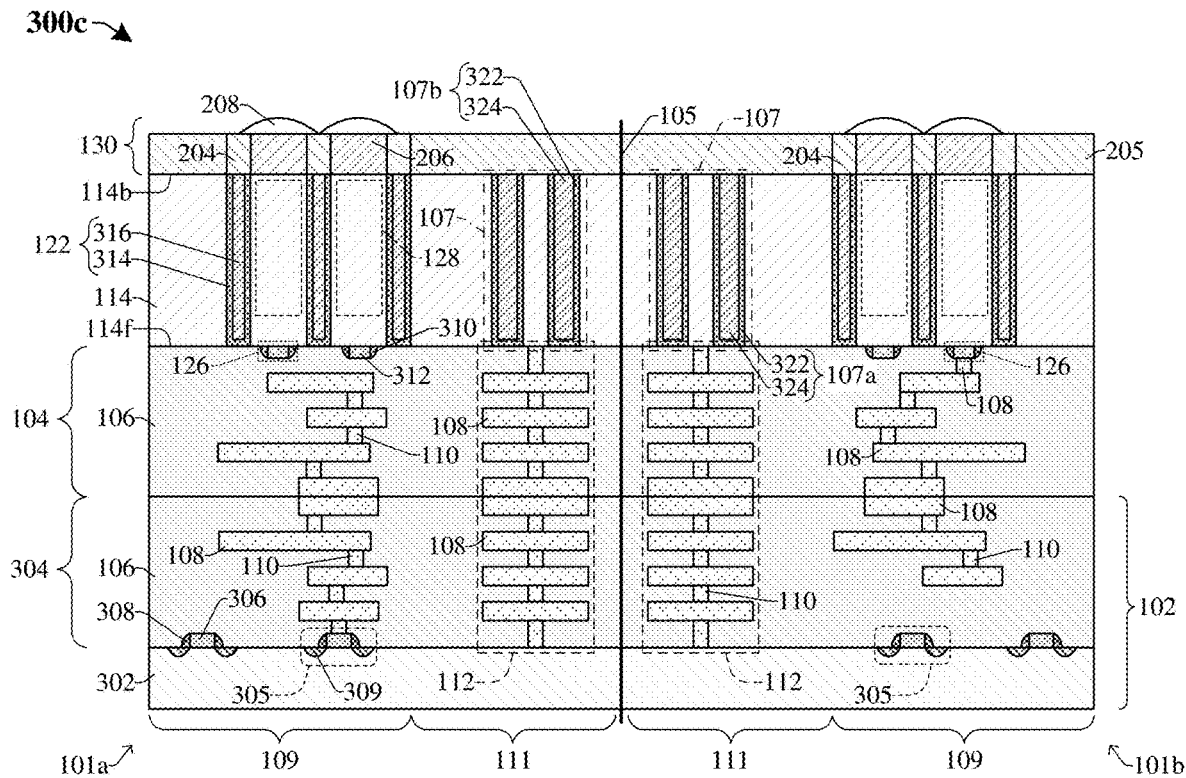

FIG. 3C illustrates a cross-sectional view of a semiconductor wafer 300c according to some alternative embodiments of the semiconductor wafer 300b of FIG. 3B, in which the crack-stop structure 107 includes an outer crack-stop structure 107a and an inner crack-stop structure 107b.

In some embodiments the inner and outer crack-stop structures 107a, 107b respectively include the first crack-stop layer 322 and the second crack stop layer 324. In further embodiments, the inner and outer crack-stop structures 107a, 107b respectively extend from the front-side 114f to the back-side 114b of the semiconductor substrate 114. In yet further embodiments, the second isolation structures 122 may respectively continuously extend from the front-side 114f to the back-side 114b.

Figure 3D:
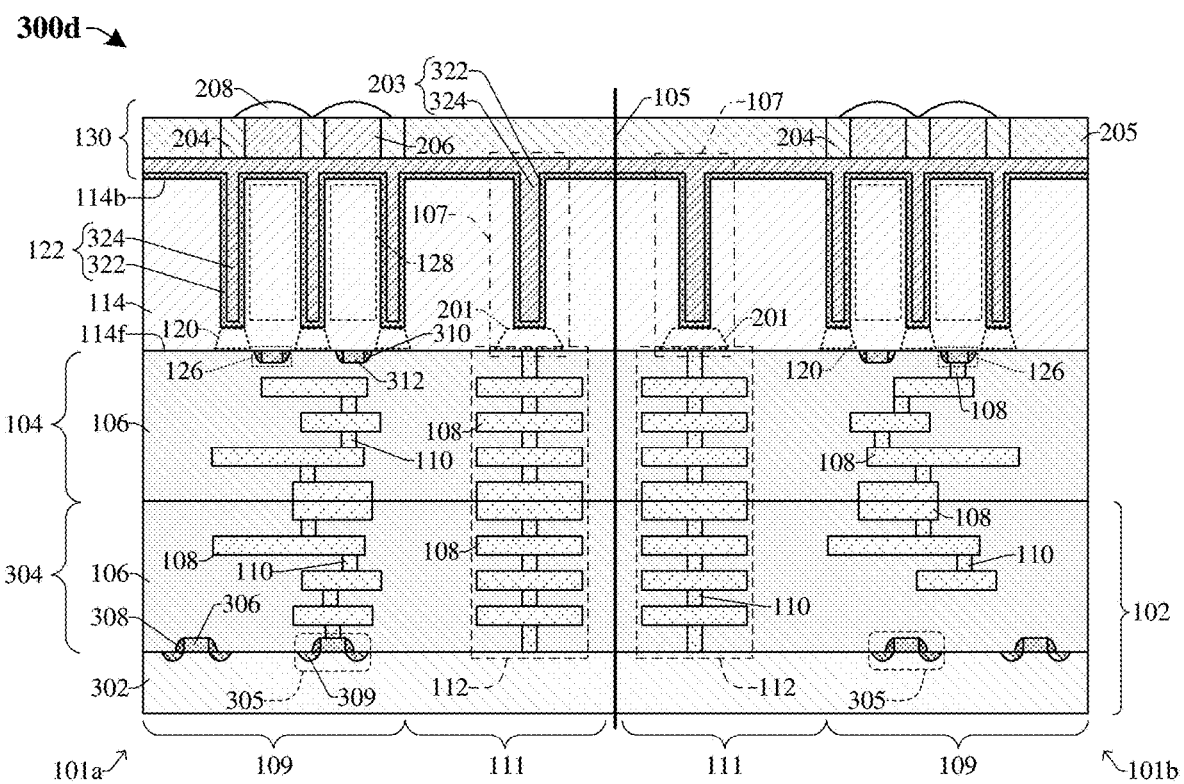

FIG. 3D illustrates a cross-sectional view of a semiconductor wafer 300d according to some alternative embodiments of the semiconductor wafer 300a of FIG. 3A.

In some embodiments, the crack-stop structures 107 respectively include the first crack-stop segment 201 and the second crack-stop segment 203. The second crack-stop segments 203 and the second isolation structures 122 each comprise the first crack-stop layer 322 and the second crack-stop layer 324. In some embodiments, the first and second crack-stop layers 322, 324 continuously extend across the back-side 114b of the semiconductor substrate 114. In yet further embodiments, the first crack-stop segment 201 and/or the first isolation structure 120 may be omitted.

In some embodiments, the semiconductor wafers 300a-d of FIGS. 3A-3D illustrate some embodiments of forming the crack-stop structures 107 and/or the second isolation structures 122 during a back end of line (BEOL) process. In such embodiments, the interconnect structure 104 is formed over the front-side 114f of the semiconductor substrate 114 before forming the crack-stop structures 107 and/or the second isolation structures 122. Further, in some embodiments, due to, for example, an over-etch, the crack-stop structure 107 and/or the second isolation structures 122 may respectively vertically extend below the front-side 114f into the interconnect structure 104 (not shown).

Figure 4A:
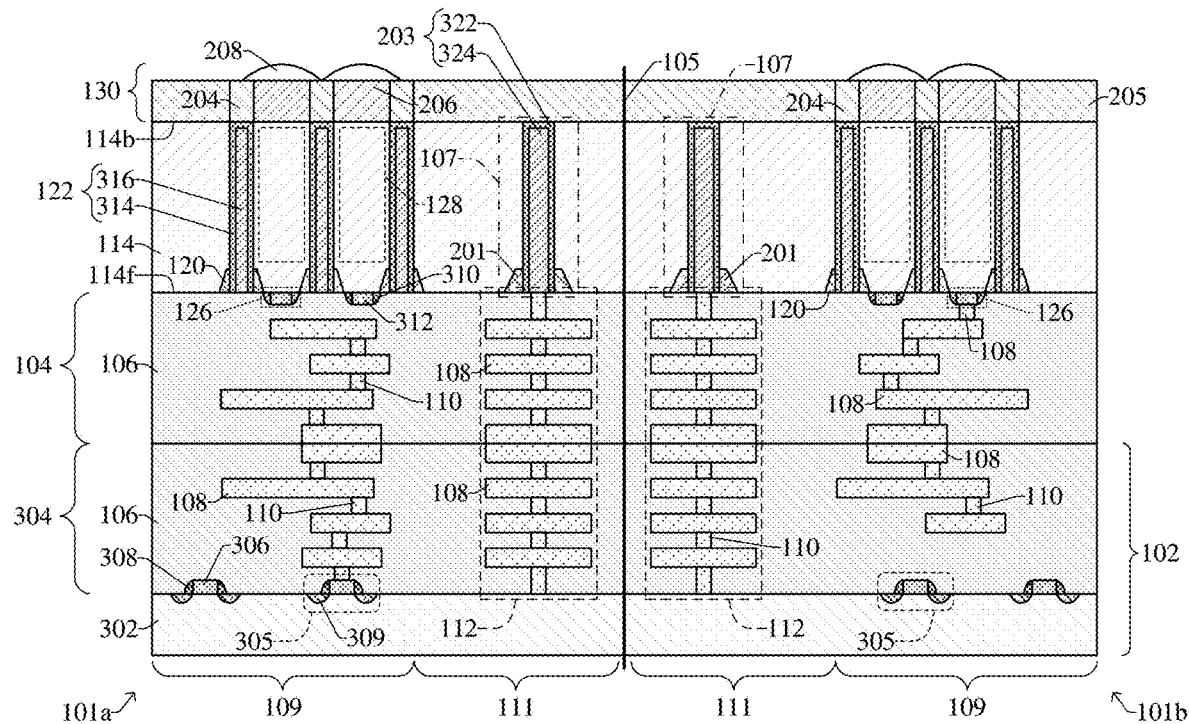
FIGS. 4A-4G illustrate various cross-sectional views of alternative embodiments of a semiconductor wafer having crack-stop structures that extend from a front-side of a semiconductor substrate to a point above the front-side of the semiconductor substrate.

FIG. 4A illustrates a cross-sectional view of a semiconductor wafer 400a according to some alternative embodiments of the semiconductor wafer 100 of FIGS. 1A-1C.

In some embodiments, the crack-stop structures 107 include the first crack-stop segment 201 and the second crack-stop segment 203. In further embodiments, the first crack-stop segment 201 may extend from the front-side 114f to a point above the front-side 114f and the second crack-stop segment 203 may extend from the front-side 114f to the back-side 114b. In such embodiments, the second crack-stop segment 203 may extend through at least a portion of the first crack-stop segment 201. Further, in some embodiments, the second isolation structures 122 may extend through the first isolation structures 120 from the front-side 114f to the back-side 114b.

Figure 4B:
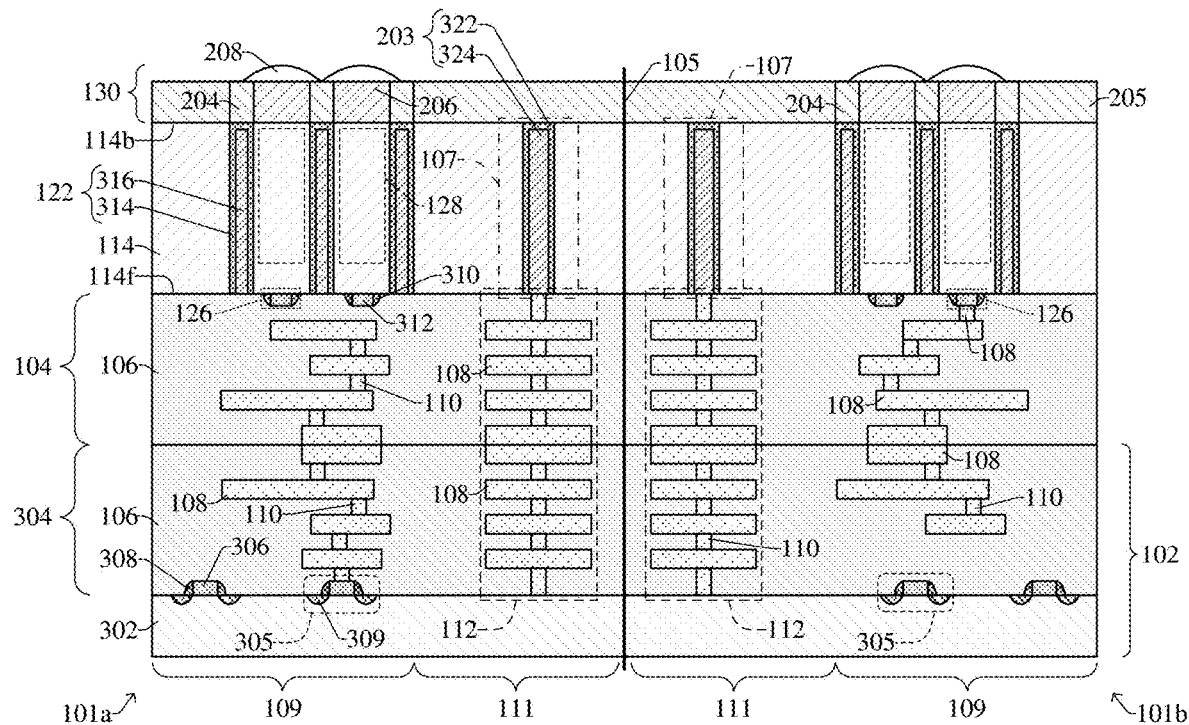

FIG. 4B illustrates a cross-sectional view of a semiconductor wafer 400b according to some alternative embodiments of the semiconductor wafer 100 of FIGS. 1A-1C.

In some embodiments, the crack-stop structures 107 include the second crack-stop segment 203, where the second crack-stop segment 203 continuously extends from the front-side 114f to the back-side 114b. Further, the second crack-stop segment 203 includes the first crack-stop layer 322 and the second crack-stop layer 324. In such embodiments, the second crack-stop layer 324 extends from the front-side 114f to a point vertically below the back-side 114b.

Figure 4C:
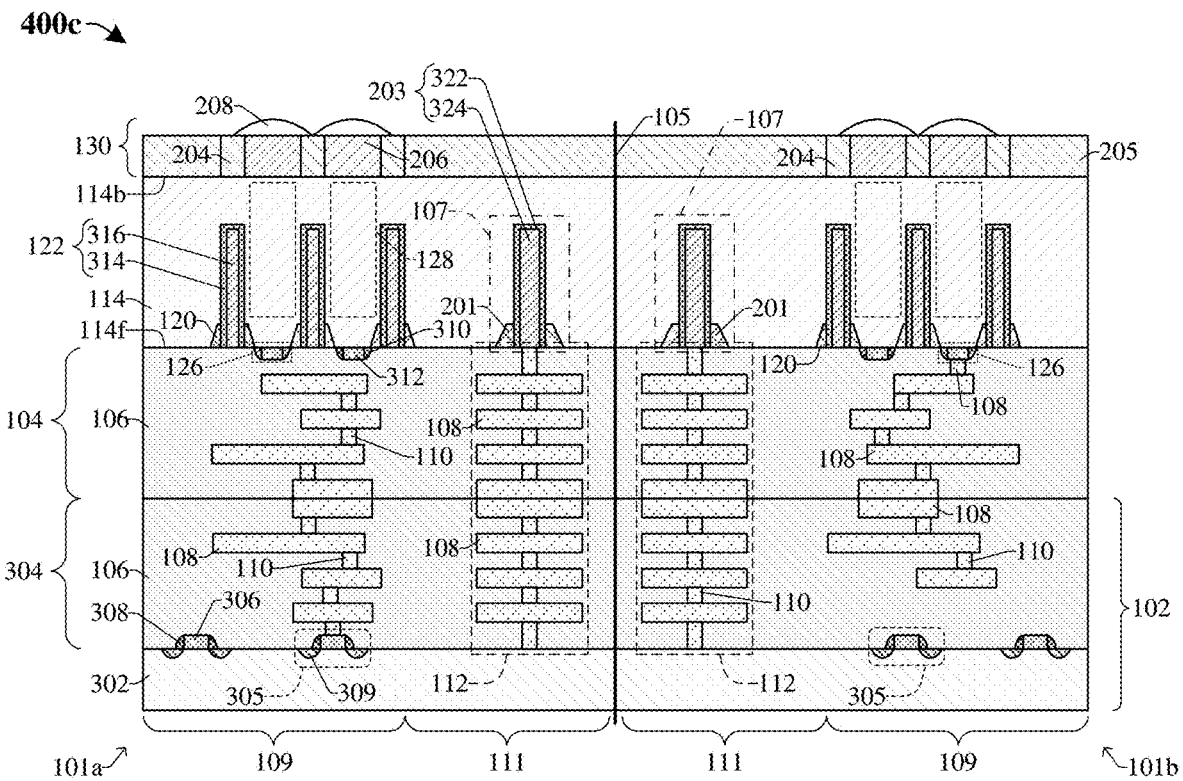

FIG. 4C illustrates a cross-sectional view of a semiconductor wafer 400c according to some alternative embodiments of the semiconductor wafer 400a of FIG. 4A, in which the second crack-stop segment 203 and/or the second isolation structure 122 vertically extend from the front-side 114f of the semiconductor substrate 114 to a point below the back-side 114b.

Figure 4D:
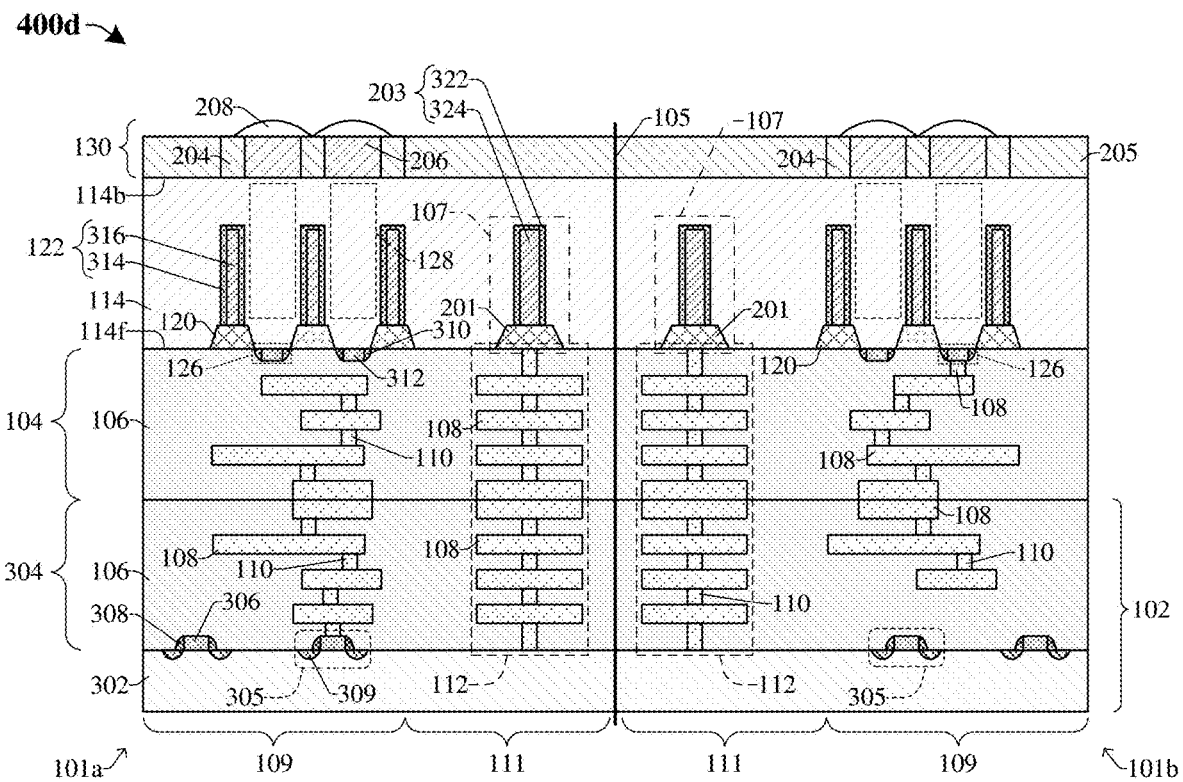

FIG. 4D illustrates a cross-sectional view of a semiconductor wafer 400d according to some alternative embodiments of the semiconductor wafer 400c of FIG. 4C, in which the second crack-stop segment 203 extends from an upper surface of the first crack-stop segment 201 to a point vertically below the back-side 114b of the semiconductor substrate 114. In further embodiments, the second isolation structure 122 extends from an upper surface of the first isolation structure 120 to the point vertically below the back-side 114b.

Figure 4E:
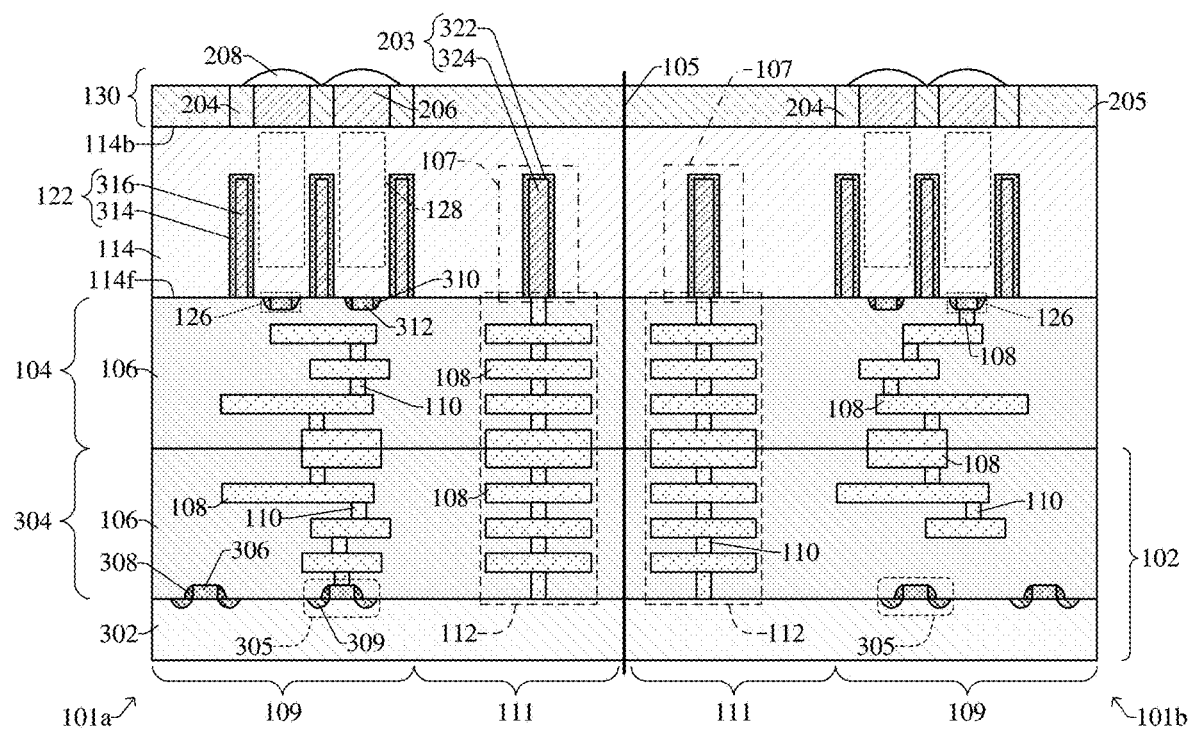

FIG. 4E illustrates a cross-sectional view of a semiconductor wafer 400e according to some alternative embodiments of the semiconductor wafer 400a of FIG. 4A, in which the first crack-stop segment 201 (of FIG. 4A) and/or the first isolation structure (120 of FIG. 4A) are omitted. In some embodiments, by omitting the first crack-stop segment 201 (of FIG. 4A) and/or the first isolation structure (120 of FIG. 4A), costs and time associated with forming the semiconductor wafer 400e may be reduced.

Figure 4F:
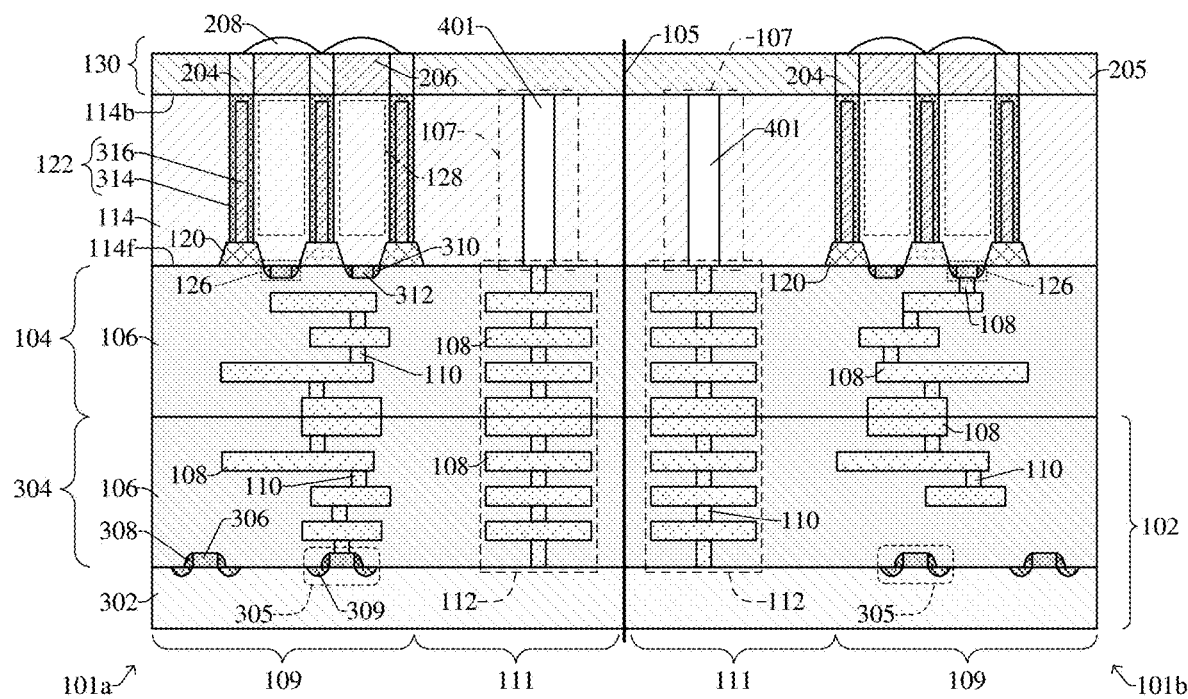

FIG. 4F illustrates a cross-sectional view of a semiconductor wafer 400f according to some alternative embodiments of the semiconductor wafer 400a of FIG. 4A, in which the crack-stop structures 107 are respectively comprised of a crack-stop opening 401. In such embodiments, the crack-stop structures 107 may, for example, be or comprise air.

Figure 4G:
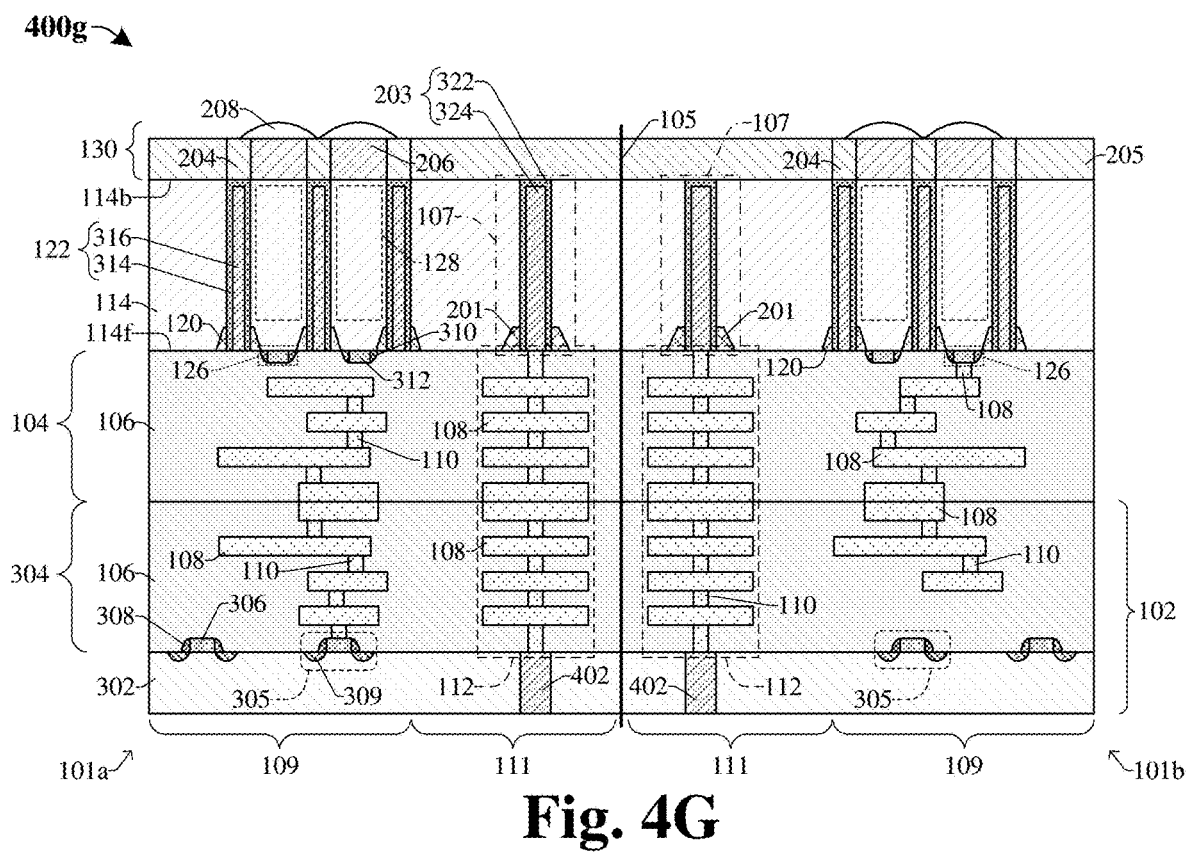

FIG. 4G illustrates a cross-sectional view of a semiconductor wafer 400g according to some alternative embodiments of the semiconductor wafer 400a of FIG. 4A, in which an ASIC crack-stop structure 402 is disposed within the peripheral region 111 of the first and second dies 101a, 101b. It may be appreciated that the ASIC crack-stop structure 402 may be configured as the crack-stop structure 107 of FIG. 1A-1C, 2A-2B, 3A-3D, or 4A-4F (not shown). Thus, the ASIC crack-stop structure 402 is configured to prevent damage to the one or more logic devices 305 disposed within and/or on the ASIC substrate 302 during a singulation process performed along the scribe line 105. This in turn may further increase a process yield, performance, endurance, and/or structural integrity of the semiconductor wafer 400f. In yet further embodiments, it may be appreciated that the ASIC crack-stop structure 402 of FIG. 4F may be disposed within the semiconductor structure 102 of FIG. 1A-1C, 2A-2B, 3A-3D, or 4A-4F (not shown).

In some embodiments, the semiconductor wafers 400a-g of FIGS. 4A-4G illustrate some embodiments of forming the crack-stop structures 107 and/or the second isolation structures 122 during a front end of line (FEOL) process. In such embodiments, the interconnect structure 104 is formed over the front-side 114f of the semiconductor substrate 114 after forming the crack-stop structures 107 and/or the second isolation structures 122.

FIGS. 5-16 illustrate cross-sectional views 500-1600 of some embodiments of a first method for forming an integrated chip having a crack-stop structure laterally surrounding a device region according to the present disclosure. Although the cross-sectional views 500-1600 shown in FIGS. 5-16 are described with reference to a first method, it will be appreciated that the structures shown in FIGS. 5-16 are not limited to the first method but rather may stand alone separate of the first method. Furthermore, although FIGS. 5-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
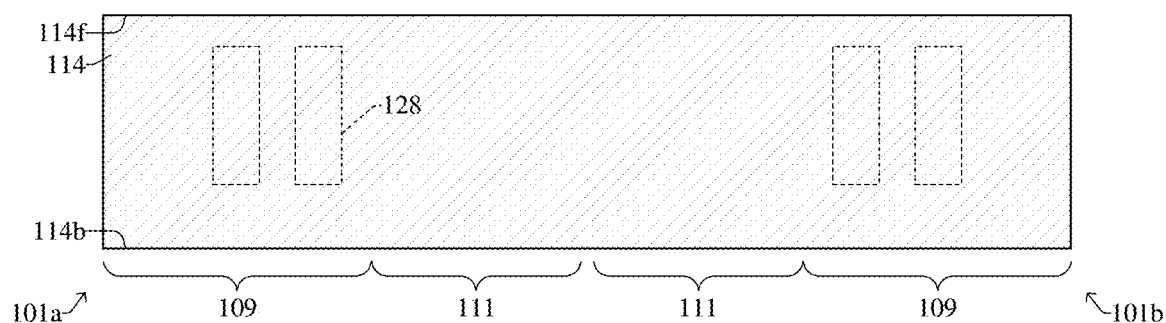
FIGS. 5-16 illustrate a series of cross-sectional views of some embodiments of a first method for forming a crack-stop structure around a device region in a semiconductor substrate.

As shown in the cross-sectional view 500 of FIG. 5, a semiconductor substrate 114 is provided and a plurality of photodetectors 128 are formed within the semiconductor substrate 114. In some embodiments, the semiconductor substrate 114 may, for example, be a bulk substrate (e.g., a bulk silicon substrate), a silicon-on-insulator (SOI) substrate, or some other suitable substrate and/or may have a first doping type (e.g., n-type doping). In some embodiments, a process for forming the plurality of photodetectors 128 may include: forming a masking layer (not shown) over a front-side 114f of the semiconductor substrate 114; selectively implanting dopants into the front-side 114f according to the masking layer, thereby forming the photodetectors 128 within the semiconductor substrate 114; and performing a removal process to remove the masking layer. In further embodiments, the photodetectors 128 comprise a second doping type (e.g., p-type doping) opposite the first doping type. In yet further embodiments, the semiconductor substrate 114 includes a first die 101a and a second die 101b laterally adjacent to one another. The first and second dies 101a, 101b respectively comprise a device region 109 laterally enclosed by a peripheral region 111. The photodetectors 128 are formed laterally within the device region 109 of the first and second dies 101a, 101b, respectively.

Figure 6:
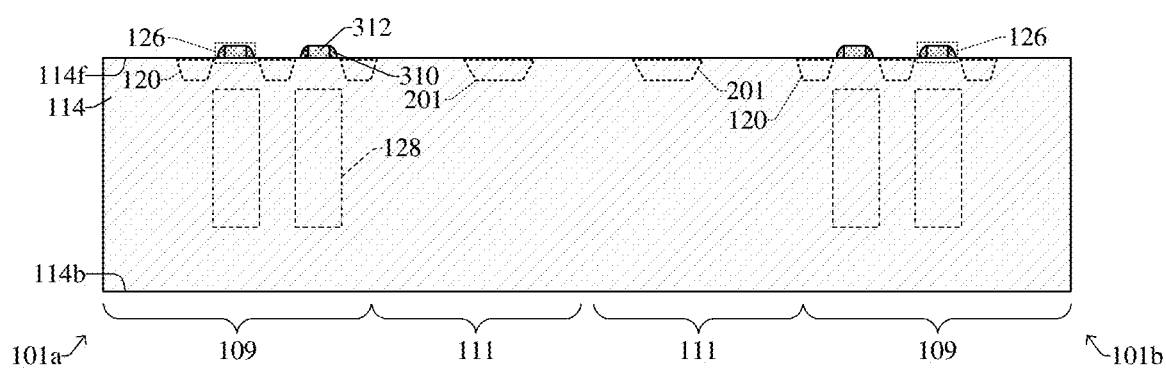

As shown in the cross-sectional view 600 of FIG. 6, one or more semiconductor devices 126 (e.g., transistors) are formed over the front-side 114f of the semiconductor substrate 114. In some embodiments, the one or more semiconductor devices 126 may, for example, be pixel devices, such as transfer transistors, source-follower transistors, select transistors, vertical transistors, a combination of the foregoing, or the like. A process for forming the one or more semiconductor devices 126 includes: forming a gate structure 312 over the front-side 114f; forming one or more doped regions (e.g., source/drain regions) within the semiconductor substrate 114; and/or forming a sidewall spacer structure 310 around sidewalls of the gate structure 312. In some embodiments, a first isolation structure 120 and/or a first crack-stop segment 201 may be formed in the front-side 114f of the semiconductor substrate 114. The first isolation structure 120 and/or the first crack-stop segments 201 extend from the front-side 114f to a point below the front-side 114f. In some embodiments, a process for forming the first isolation structure 120 and/or the first crack-stop segment 201 includes: forming a masking layer (not shown) over the front-side 114f; selectively etching the semiconductor substrate 114 according to the masking layer to define a plurality of trenches; depositing (e.g., by chemical vapor deposition (CVD), physical vapor deposition (PVD), atomic layer deposition (ALD), etc.) a dielectric material (e.g., silicon dioxide, silicon nitride, silicon carbide, a combination of the foregoing, or the like) in the trenches, thereby defining the first isolation structure 120 and/or the first crack-stop segments 201; and performing a removal process to remove the masking layer. In yet further embodiments, the first isolation structure 120 and/or the first crack-stop segment 201 may each be configured as shallow trench isolation (STI) structures.

Figure 7:
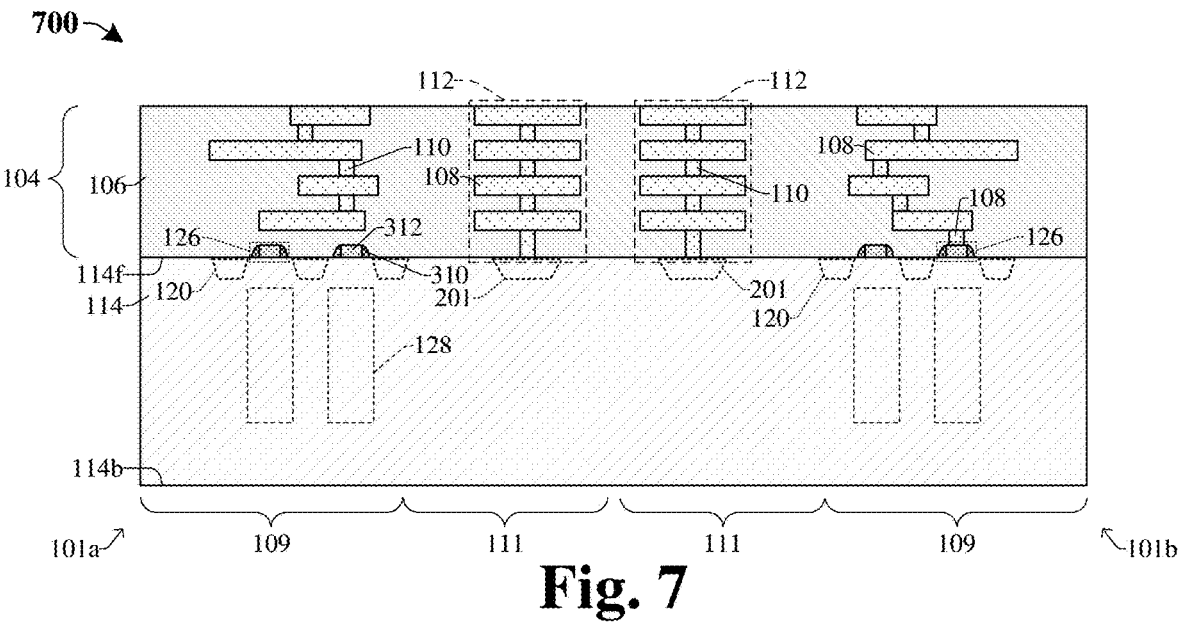

As shown in the cross-sectional view 700 of FIG. 7, an interconnect structure 104 is formed over the front-side 114f of the semiconductor substrate 114 and the one or more semiconductor devices 126. In some embodiments, the interconnect structure 104 includes an interconnect dielectric structure 106, a plurality of conductive vias 110, and a plurality of conductive wires 108. In further embodiments, the interconnect dielectric structure 106 comprises a plurality of inter-level dielectric (ILD) layers that may, for example, respectively be or comprise an oxide, such as silicon dioxide, a low-k dielectric material, an extreme low-k dielectric material, another suitable dielectric material, or the like. In further embodiments, the conductive vias 110 and/or the conductive wires 108 may, for example, be formed by a single damascene process and/or a dual damascene process. Seal ring structures 112 extend from the front-side 114f of the semiconductor substrate 114 to a top surface of the interconnect structure 104. The seal ring structures 112 are disposed within the peripheral region 111 of the first and second dies 101a, 101b, respectively and laterally enclose the device regions 109. In some embodiments, the seal ring structure 112 directly overlies the first crack-stop segment 201.

Figure 8:
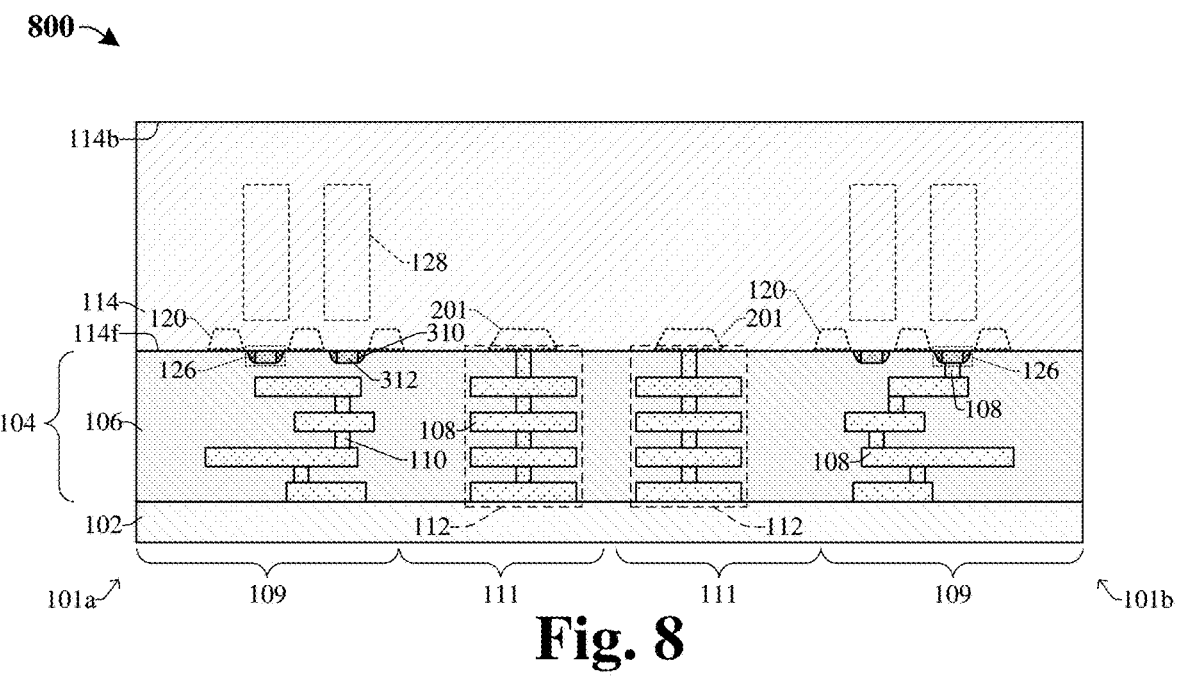

As shown in the cross-sectional view 800 of FIG. 8, the structure of FIG. 7 is rotated and bonded to a semiconductor structure 102. In some embodiments, the bonding process may include performing a fusion bonding process, a eutectic bonding process, a combination of the foregoing, or another suitable bonding process. In some embodiments, the semiconductor structure 102 may be configured as the semiconductor structure 102 of FIG. 3A or may be configured as a carrier substrate.

Figure 9:
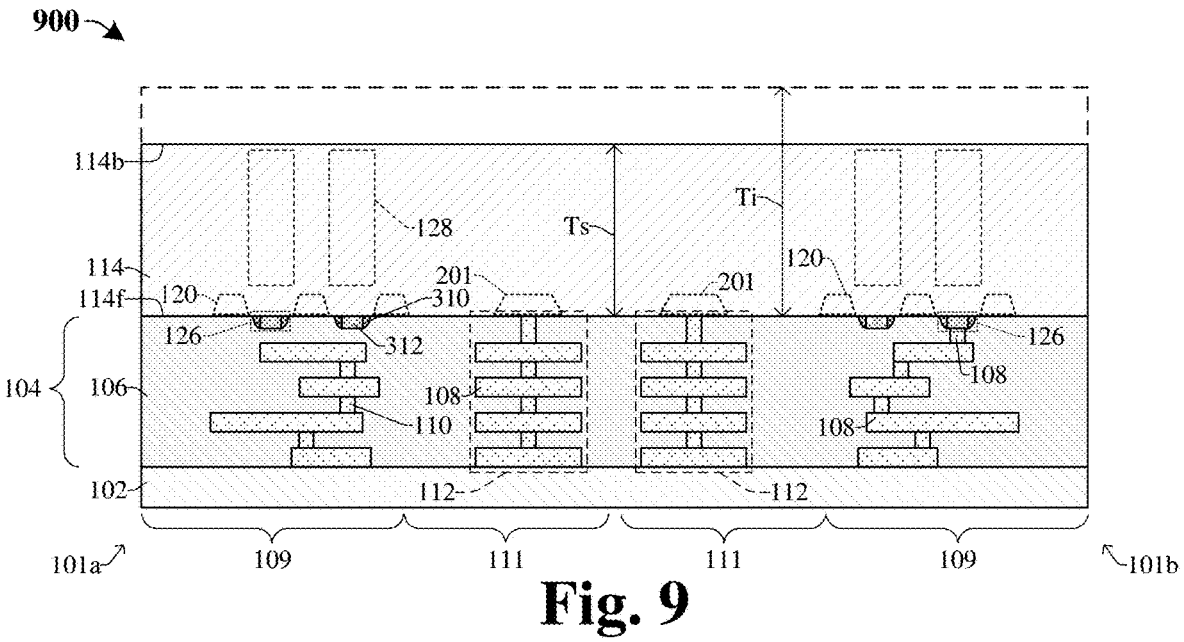

As shown in the cross-sectional view 900 of FIG. 9, a thinning process is performing on the semiconductor substrate 114. In some embodiments, the thinning process reduces an initial thickness Ti of the semiconductor substrate 114 to a thickness Ts. In some embodiments, the thinning process exposes an upper surface of the photodetectors 128. In further embodiments, the thinning process may include performing a planarization process (e.g., a chemical mechanical planarization (CMP) process), a grinding process, and/or one or more etching process(es).

Figure 10:
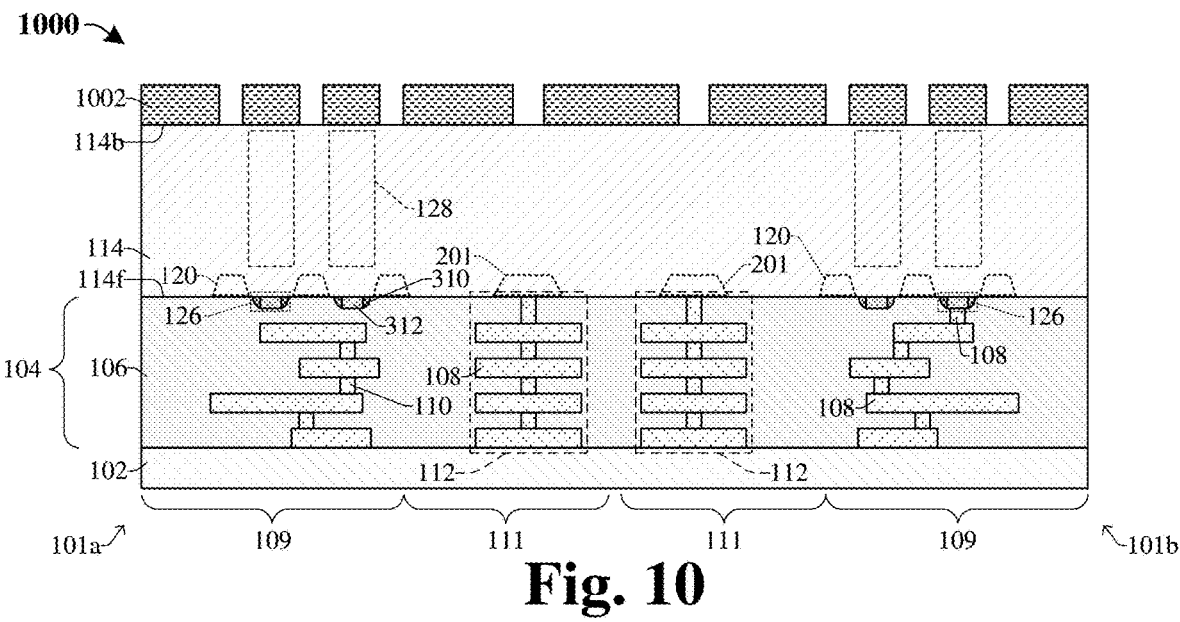

As shown in the cross-sectional view 1000 of FIG. 10, a masking layer 1002 is formed over the back-side 114b of the semiconductor substrate 114. The masking layer 1002 may, for example, be or comprise a hard mask layer, a photoresist, or the like. In some embodiments, the masking layer 1002 comprises a plurality of sidewalls defining a plurality of openings that expose the back-side 114b.

Figure 11:
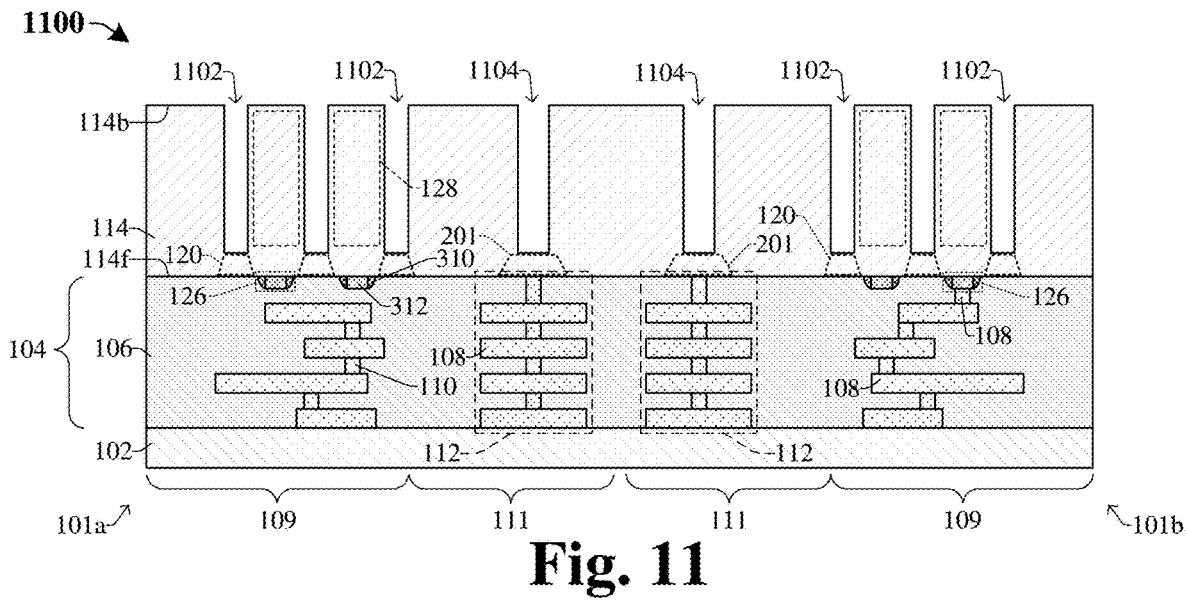

As shown in the cross-sectional view 1100 of FIG. 11, an etching process is performed on the semiconductor substrate 114 according to the masking layer (1002 of FIG. 10), thereby defining a plurality of isolation openings 1102 and a plurality of crack-stop openings 1104. In some embodiments, the etching process includes performing a dry etch process on the semiconductor substrate 114. In further embodiments, the plurality of isolation openings 1102 and the plurality of crack-stop openings 1104 extend from the back-side 114b to a point below the back-side 114b. In yet further embodiments, the point is aligned with an upper surface of the first crack-stop segment 201 and the first isolation structure 120.

Figure 12:
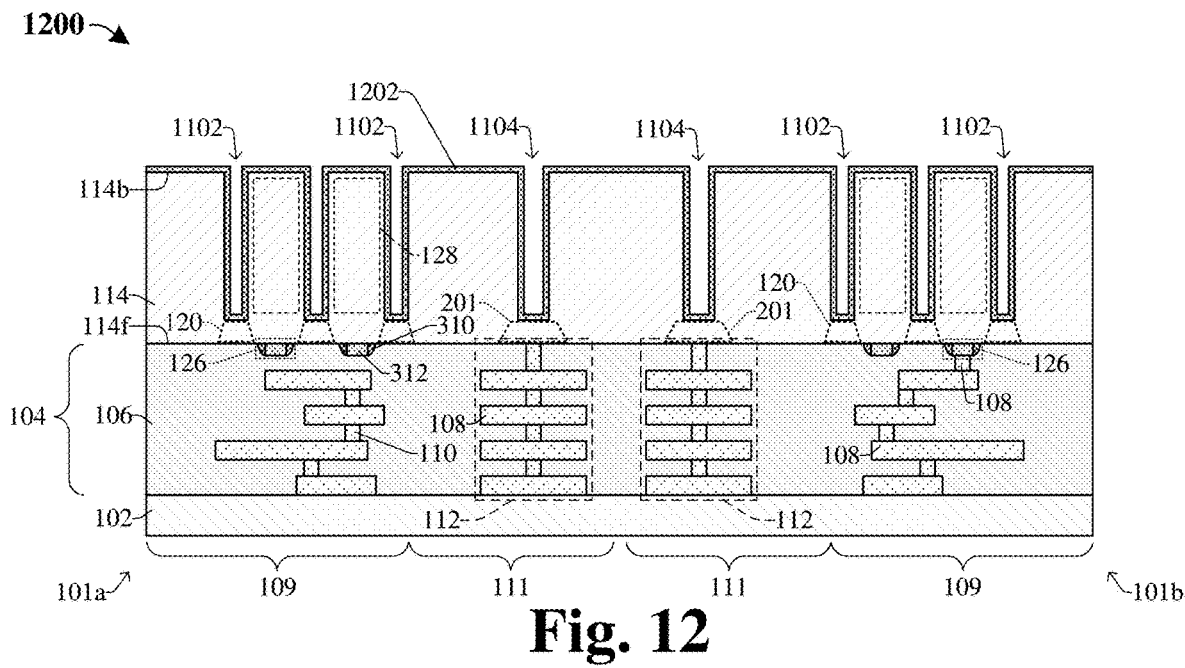

As shown in the cross-sectional view 1200 of FIG. 12, a passivation layer 1202 is formed over the back-side 114b of the semiconductor substrate 114. The passivation layer 1202 at least partially lines the isolation openings 1102 and crack-stop openings 1104. In some embodiments, the passivation layer 1202 may be deposited by CVD, PVD, ALD, or another suitable deposition process. In further embodiments, the passivation layer 1202 may, for example, be or comprise silicon nitride, silicon carbide, hafnium oxide, aluminum oxide, or the like.

Figure 13:
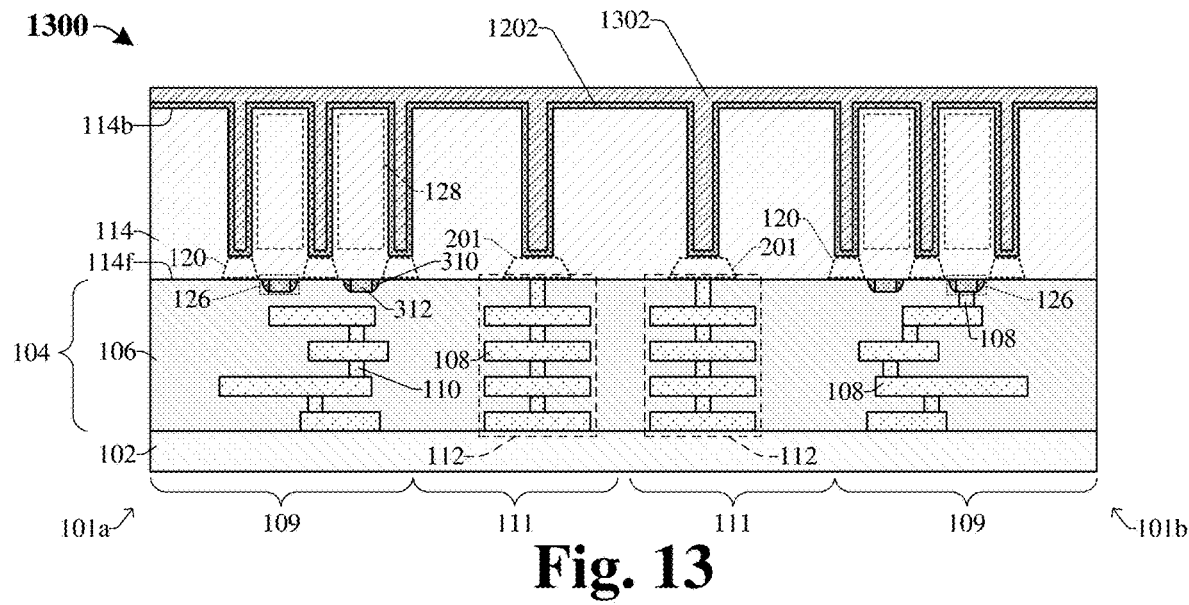

As shown in the cross-sectional view 1300 of FIG. 13, an upper isolation structure 1302 is formed over the semiconductor substrate 114 and the passivation layer 1202. In some embodiments, the upper isolation structure 1302 fills a remaining portion of the isolation openings (1102 of FIG. 12) and the crack-stop openings (1104 of FIG. 12). In some embodiments, the upper isolation structure 1302 may, for example, be or comprise silicon oxide, silicon nitride, silicon carbide, a metal oxide, a metal, such as aluminum, copper, tungsten, titanium, another suitable material, or the like.

Figure 14:
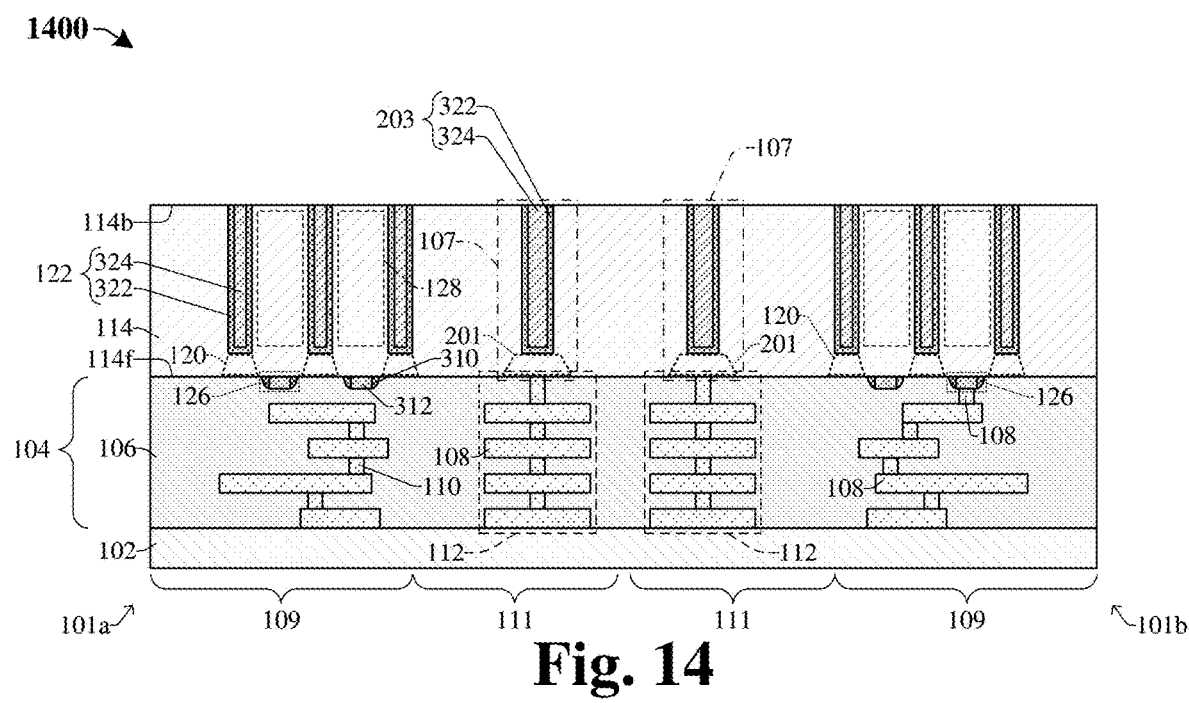

As shown in the cross-sectional view 1400 of FIG. 14, a planarization process (e.g., a CMP process) is performed on the passivation layer (1202 of FIG. 13) and the upper isolation structure (1302 of FIG. 13) until the back-side 114b of the semiconductor substrate 114 is exposed, thereby defining a second isolation structure 122 and a second crack-stop structure 203. In some embodiments, the second isolation structure 122 and the second crack-stop structure 203 comprise a first crack-stop layer 322 and a second crack-stop layer 324.

Figure 15:
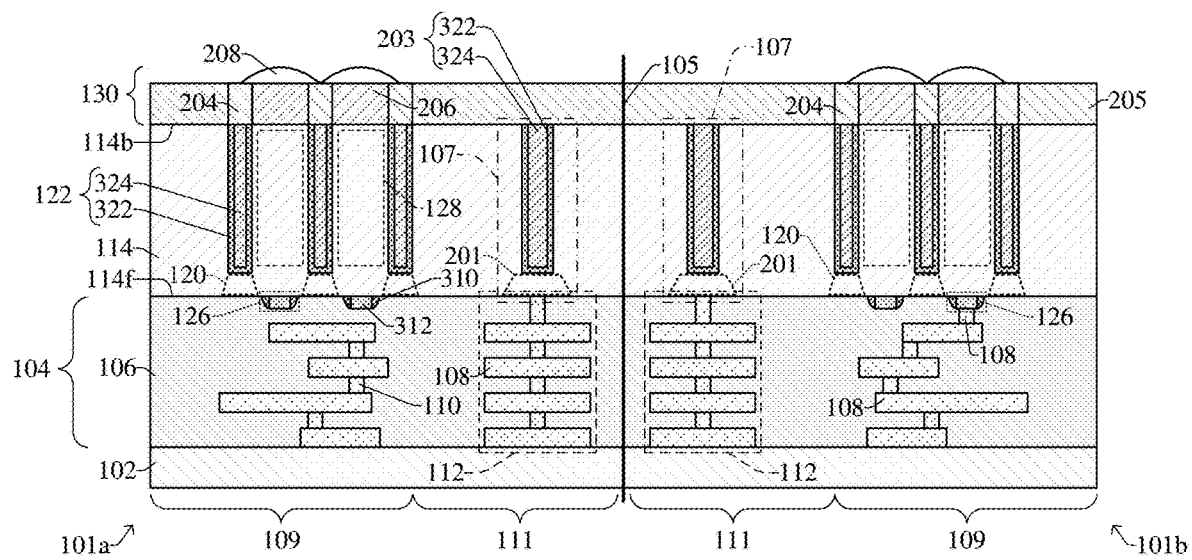

As shown in the cross-sectional view 1500 of FIG. 15, an upper pixel structure 130 is formed over the back-side 114b of the semiconductor substrate 114. In some embodiments, the upper pixel structure 130 includes an upper dielectric structure 205, a grid structure 204, a plurality of color filters 206, and a plurality of micro-lenses 208. In further embodiments, the upper dielectric structure 205, the grid structure 204, and/or the plurality of color filters 206 may, for example, be deposited or grown by CVD, PVD, ALD, sputtering, electroless plating, or another suitable growth or deposition process. In further embodiments, a scribe line 105 is disposed laterally between the first die 101a and the second die 101b.

Figure 16:
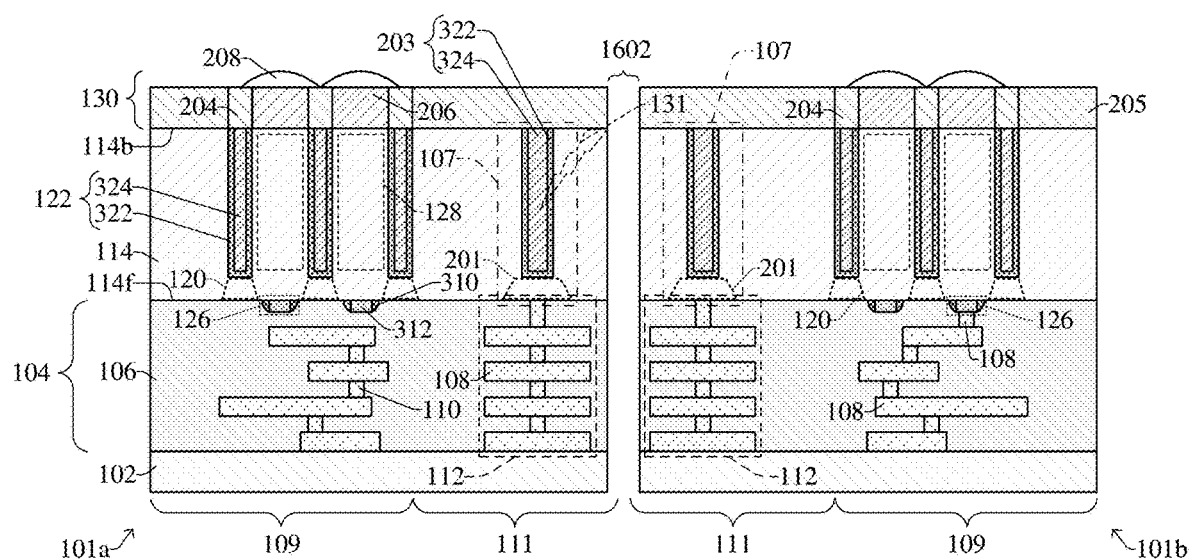

As shown in the cross-sectional view 1600 of FIG. 16, a singulation process is performed along the scribe line (105 of FIG. 15) to singulate the first die 101a and the second die 101b. In such embodiments, the first die 101a is configured as a first integrated chip and the second die 101b is configured as a second integrated chip. In some embodiments, the singulation process may include cutting the structure of FIG. 15 along the scribe line (105 of FIG. 15) with a blade saw (not shown). The blade saw may be attached to a housing (not shown) that holds a motor (not shown) driving a rotor to which the blade saw is fixed. In some embodiments, the blade saw is configured to cut along the scribe line (105 of FIG. 15) and completely cut through the structure of FIG. 15. In further embodiments, the blade saw is a circular blade, which has a nickel-diamond cutting surface. In yet further embodiments, a cut 1602 is formed by the blade saw and has a width that is about equal to a cutting diameter of the blade saw plus edge roughness. Further, the singulation process may include utilizing a laser before, after, and/or while cutting the structure of FIG. 15 with the blade saw.

In further embodiments, during the singulation process, a crack 131 may occur due to blade saw and/or laser induced damage. The crack 131 may originate along the cut 1602 and extend laterally to a sidewall of the crack-stop structure 107. In some embodiments, the crack 131 may be due to a crack in the crystal lattice of the semiconductor substrate 114. The crack 131 may, for example, extend laterally into the crack-stop structure 107. Because the crack-stop structure 107 comprises a material different from the semiconductor substrate 114, the crack 131 may be stopped and/or mitigated from reaching the device region 109. Thus, the crack-stop structure 107 is configured to prevent damage to the semiconductor devices 126 and/or the photodetectors 128 during the fabrication process.

Figure 17:
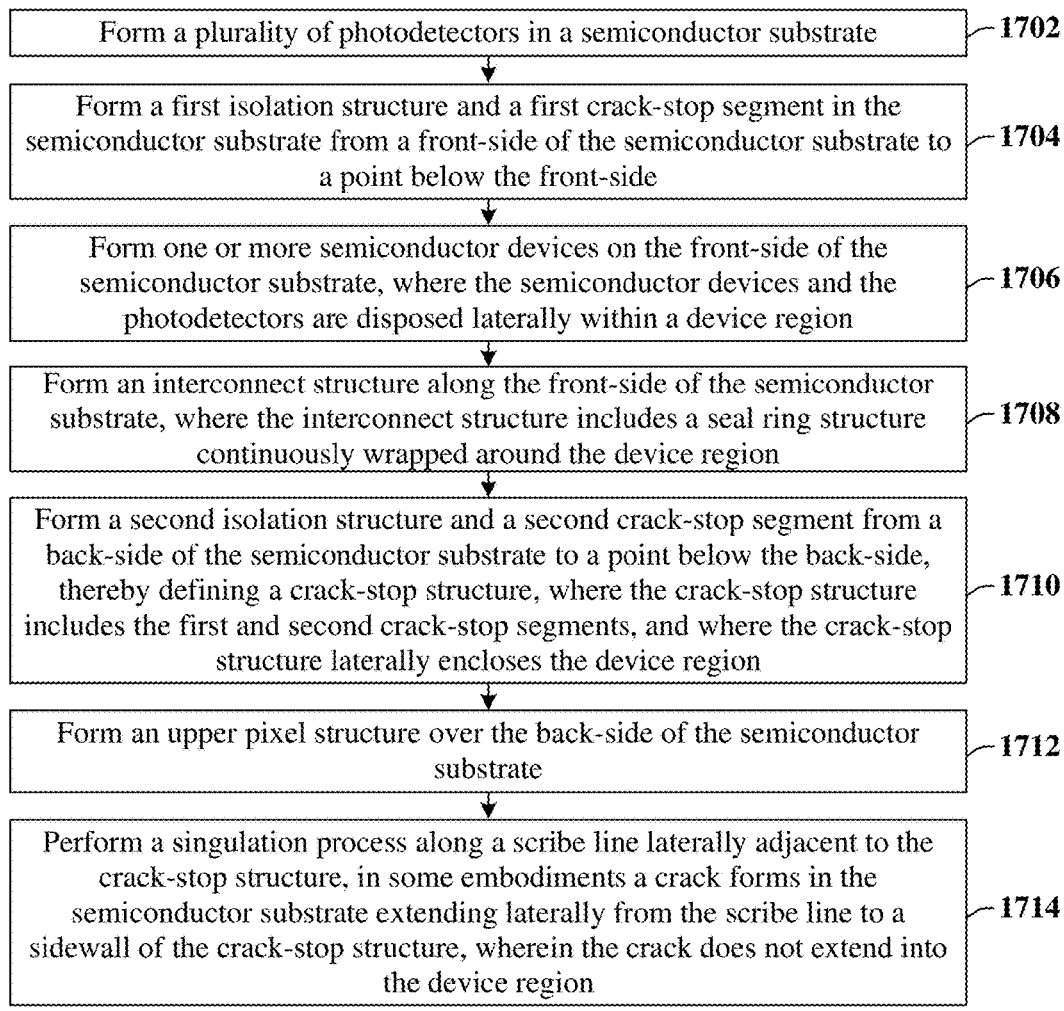
FIG. 17 illustrates a block diagram of some embodiments of the first method of FIGS. 5-16.

FIG. 17 illustrates a first method 1700 for forming an integrated chip having a crack-stop structure laterally surrounding a device region according to the present disclosure. Although the first method 1700 illustrates and/or describes a series of acts or events, it will be appreciated that the first method 1700 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1702, a plurality of photodetectors are formed in a semiconductor substrate. FIG. 5 illustrates a cross-sectional view 500 corresponding to some embodiments of act 1702.

At act 1704, a first isolation structure and a first crack-stop segment are formed in the semiconductor substrate from a front-side of the semiconductor substrate to a point below the front-side. FIG. 6 illustrates a cross-sectional view 600 corresponding to some embodiments of act 1704.

At act 1706, one or more semiconductor devices are formed on the front-side of the semiconductor substrate. The semiconductor devices and the photodetectors are disposed laterally within a device region. FIG. 6 illustrates a cross-sectional view 600 corresponding to some embodiments of act 1706.

At act 1708, an interconnect structure is formed along the front-side of the semiconductor substrate. The interconnect structure includes a seal ring structure that continuously wraps around the device region. FIG. 7 illustrates a cross-sectional view 700 corresponding to some embodiments of act 1708.

At act 1710, a second isolation structure and a second crack-stop segment are formed from a back-side of the semiconductor substrate to a point below the back-side, thereby defining a crack-stop structure. The crack-stop structure includes the first and second crack-stop segments. The crack-stop structure laterally encloses the device region. FIGS. 10-14 illustrate cross-sectional views 1000-1400 corresponding to some embodiments of act 1710.

At act 1712, an upper pixel structure is formed over the back-side of the semiconductor substrate. FIG. 15 illustrates a cross-sectional view 1500 corresponding to some embodiments of act 1712.

At act 1714, a singulation process is performed along a scribe line laterally adjacent to the crack-stop structure. In some embodiments, a crack forms in the semiconductor substrate extending laterally from the scribe line to a sidewall of the crack-stop structure, where the crack does not extend into the device region. FIG. 16 illustrates a cross-sectional view 1600 corresponding to some embodiments of act 1714.

Figure 18:
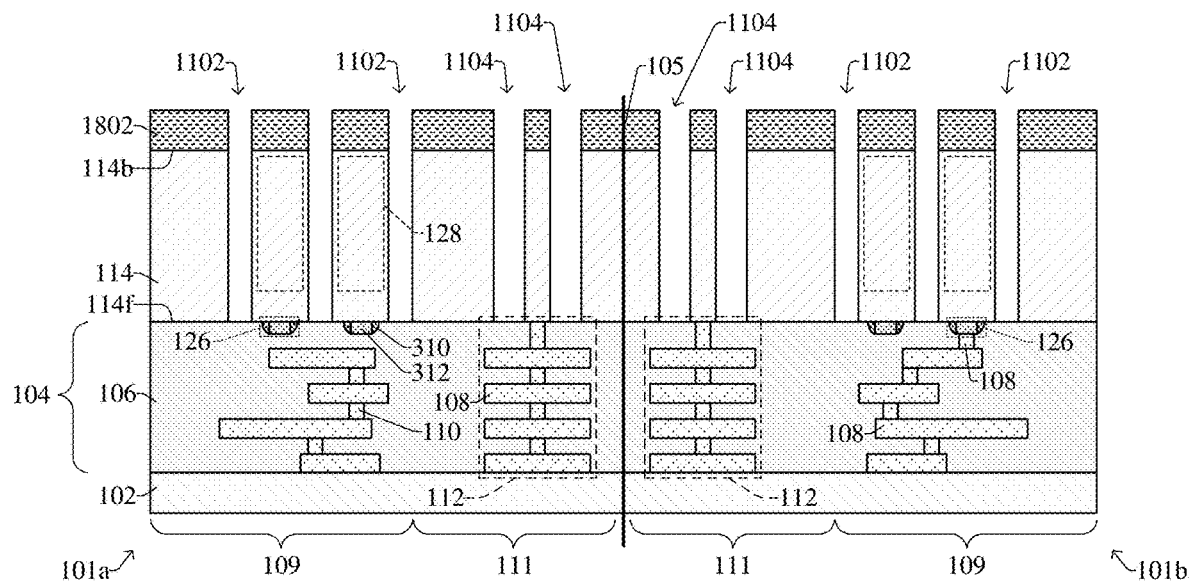
FIGS. 18 and 19 illustrate cross-sectional views of some embodiments of a method for forming a crack-stop structure around a device region in a semiconductor substrate, in which the crack-stop structure comprises an inner crack-stop structure and an outer crack-stop structure.
Figure 19:
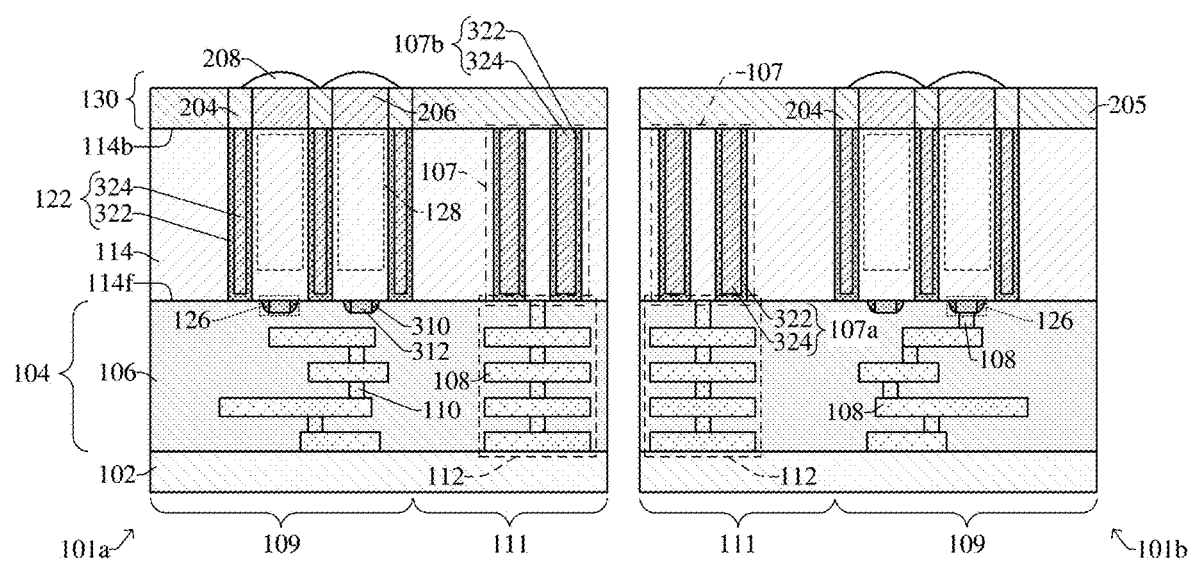

In some embodiments, FIG. 18 illustrates a cross-sectional view 1800 corresponding to an act that may be performed in place of the acts at FIGS. 10 and 11, such that the first method of FIGS. 5-16 may alternatively proceed from FIGS. 5-9, and then from FIG. 18 to FIGS. 12-16 (skipping FIGS. 10 and 11), such that a final structure of such an embodiment is illustrated in cross-sectional view 1900 of FIG. 19. In such embodiments, formation of the first isolation structure (120 of FIG. 6) and the first crack-stop segment (201 of FIG. 6) may be omitted and/or skipped. Further, an etching process may be performed at FIG. 18, such that the plurality of isolation openings 1102 and the plurality of crack-stop openings 1104 extend from the back-side 114b to the front-side 114f of the semiconductor substrate 114. Thus, as illustrated in the cross-sectional view 1900 of FIG. 19, the crack-stop structure 107 may include an inner crack-stop structure 107b laterally enclosed by an outer crack-stop structure 107a.

FIGS. 20-25 illustrate cross-sectional views 2000-2500 of some embodiments of a second method for forming an integrated chip having a crack-stop structure laterally surrounding a device region according to the present disclosure. Although the cross-sectional views 2000-2500 shown in FIGS. 20-25 are described with reference to a second method, it will be appreciated that the structures shown in FIGS. 20-25 are not limited to the second method but rather may stand alone separate of the second method. Furthermore, although FIGS. 20-25 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 20:
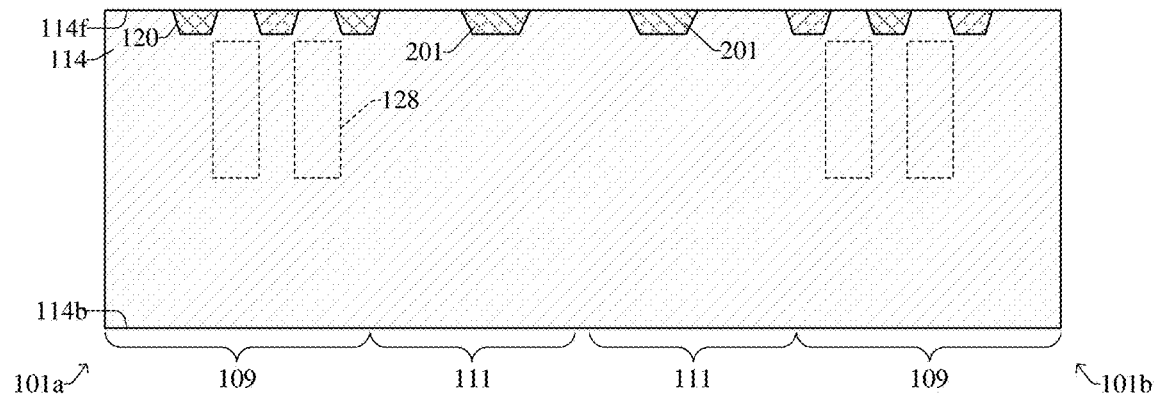
FIGS. 20-25 illustrate a series of cross-sectional views of some embodiments of a second method for forming a crack-stop structure around a device region in a semiconductor substrate.

As shown in the cross-sectional view 2000 of FIG. 20, a semiconductor substrate 114 is provided and a plurality of photodetectors 128 are formed in a device region 109 of a first and a second die 101a, 101b, respectively. Further, first isolation structures 120 are formed on a front-side 114f of the semiconductor substrate 114 and first crack-stop segments 201 are formed in the semiconductor substrate 114. In some embodiments, the photodetectors 128, the first isolation structures 120, and the first crack-stop segments 201 are formed as illustrated and/or described in the cross-sectional views 500 and 600 of FIGS. 5 and 6.

Figure 21:
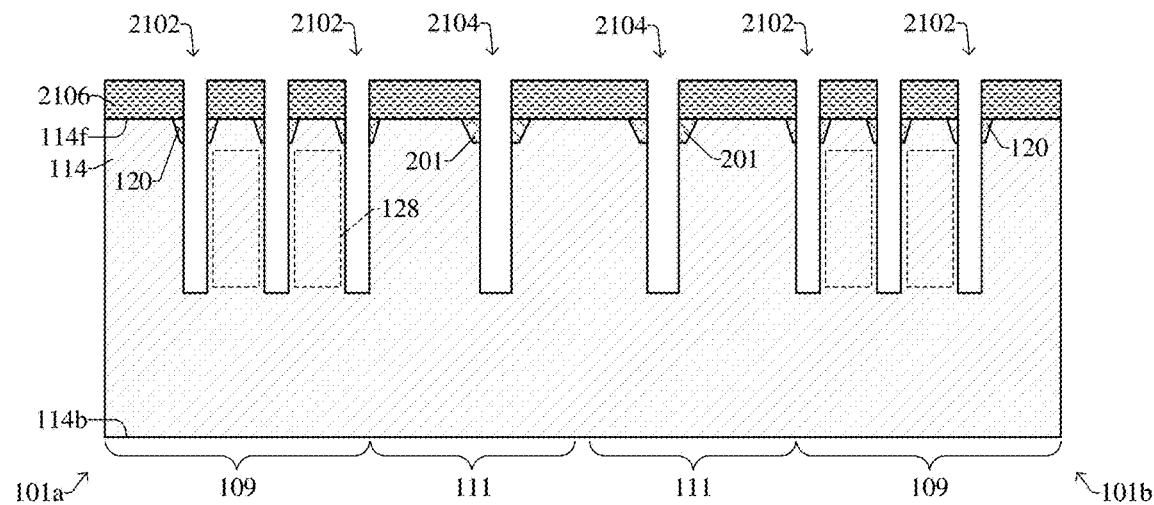

As shown in the cross-sectional view 2100 of FIG. 21, a masking layer 2106 is formed over the front-side 114f of the semiconductor substrate 114. The semiconductor substrate 114 is patterned according to the masking layer 2106 to define a plurality of isolation openings 2102 and a plurality of crack-stop openings 2104. In some embodiments, the patterning process includes exposing unmasked regions of the semiconductor substrate 114 to one or more etchants. The plurality of isolation openings 2102 and the plurality of crack-stop openings 2104 extend from the front-side 114f to a point vertically below the front-side 114f. In some embodiments, the point is vertically below the photodetectors 128. In some embodiments, after performing the patterning process, a removal process is performed to remove the masking layer 2106 (not shown).

Figure 22:
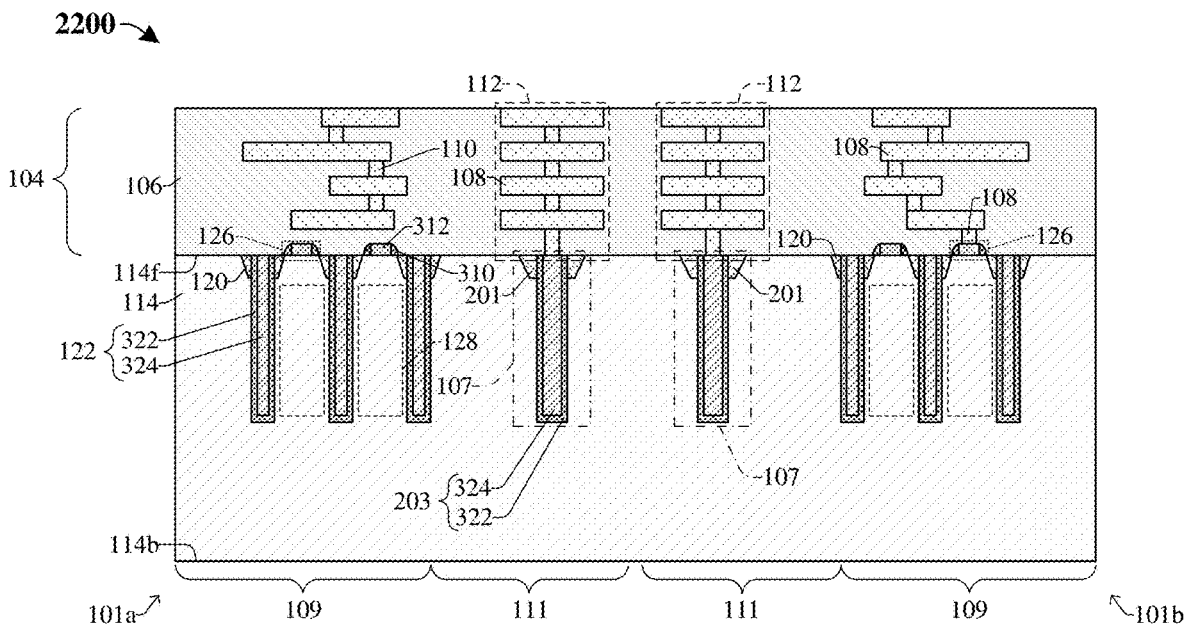

As shown in the cross-sectional view 2200 of FIG. 22, second crack-stop segments 203 are formed in the crack-stop openings (2104 of FIG. 21) and second isolation structures 122 are formed in the isolation openings (2102 of FIG. 21). This in turn defines the crack-stop structures 107. The crack-stop structures 107 each include the first crack-stop segment 201 and the second crack-stop segment 203. In some embodiments, the second crack-stop segments 203 and the second isolation structures 122 are formed as illustrated and/or described in FIGS. 12-14. Further, after forming the crack-stop structures 107, one or more semiconductor devices 126 are formed along the front-side 114f of the semiconductor substrate 114. In some embodiments, the one or more semiconductor devices 126 are formed as illustrated and/or described in FIG. 6. Furthermore, an interconnect structure 104 is formed over the front-side 114f of the semiconductor substrate 114. In some embodiments, the interconnect structure 104 is formed as illustrated and/or described in FIG. 7.

Figure 23:
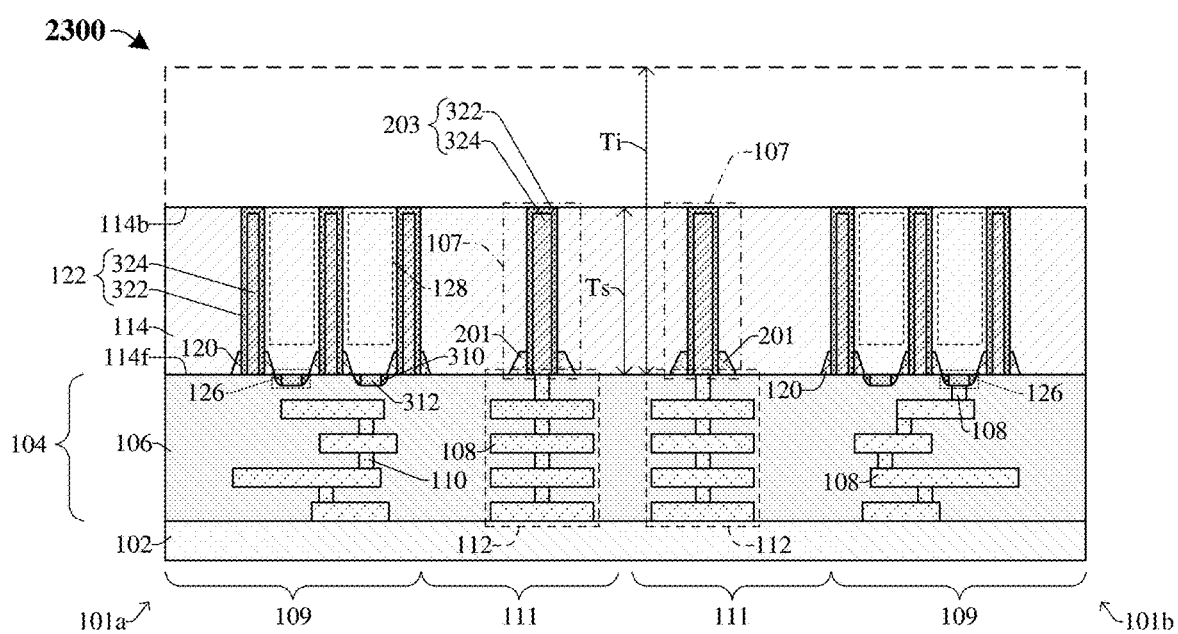

As shown in the cross-sectional view 2300 of FIG. 23, the structure of FIG. 22 is rotated and a thinning process is performed on the semiconductor substrate 114. In some embodiments, the thinning process reduces an initial thickness Ti of the semiconductor substrate 114 to a thickness Ts. Further, the thinning process exposes an upper surface of the crack-stop structure 107. In some embodiments, the thinning process may, for example, be or comprise a planarization process (e.g., a CMP process), one or more etch processes, a mechanical grinding process, a combination of the foregoing, or another suitable thinning process.

Figure 24:
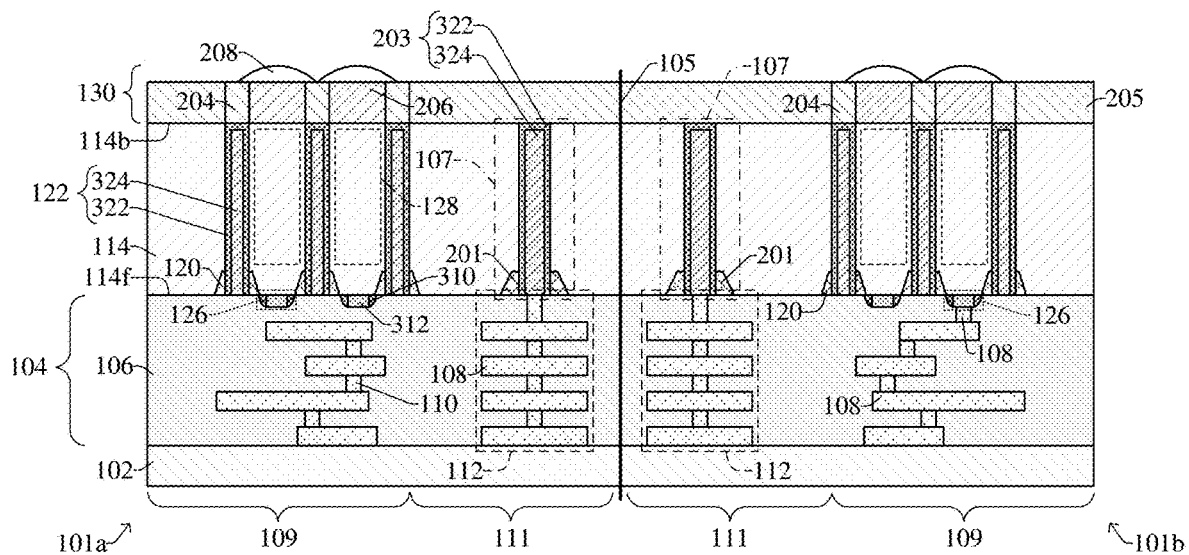

As shown in the cross-sectional view 2400 of FIG. 24, an upper pixel structure 130 is formed over the front-side 114f of the semiconductor substrate 114. In some embodiments, the upper pixel structure 130 may be formed as illustrated and/or described in FIG. 15.

Figure 25:
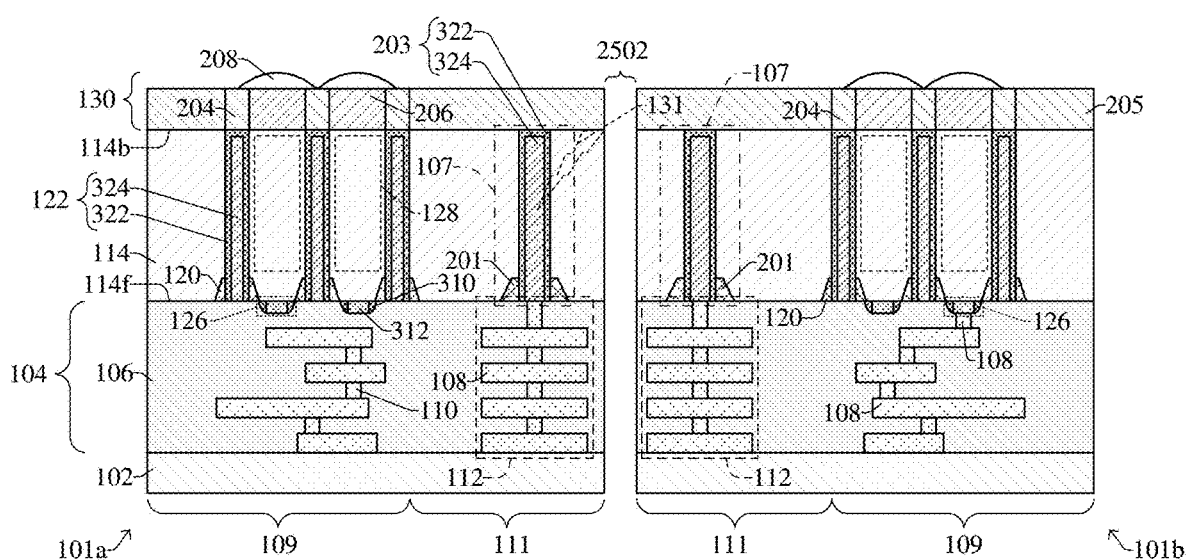

As shown in the cross-sectional view 2500 of FIG. 25, a singulation process is performed on the structure of FIG. 24. In some embodiments, the singulation process is performed as illustrated and/or described in FIG. 16. The singulation process defines a cut 2502 laterally between the first die 101a and the second die 101b. In further embodiments, during the singulation process a crack 131 may form in the semiconductor substrate 114 due to blade saw and/or laser induced damage. The crack 131 may laterally extend from the cut 2502 to a sidewall of the crack-stop structure 107.

Figure 26:
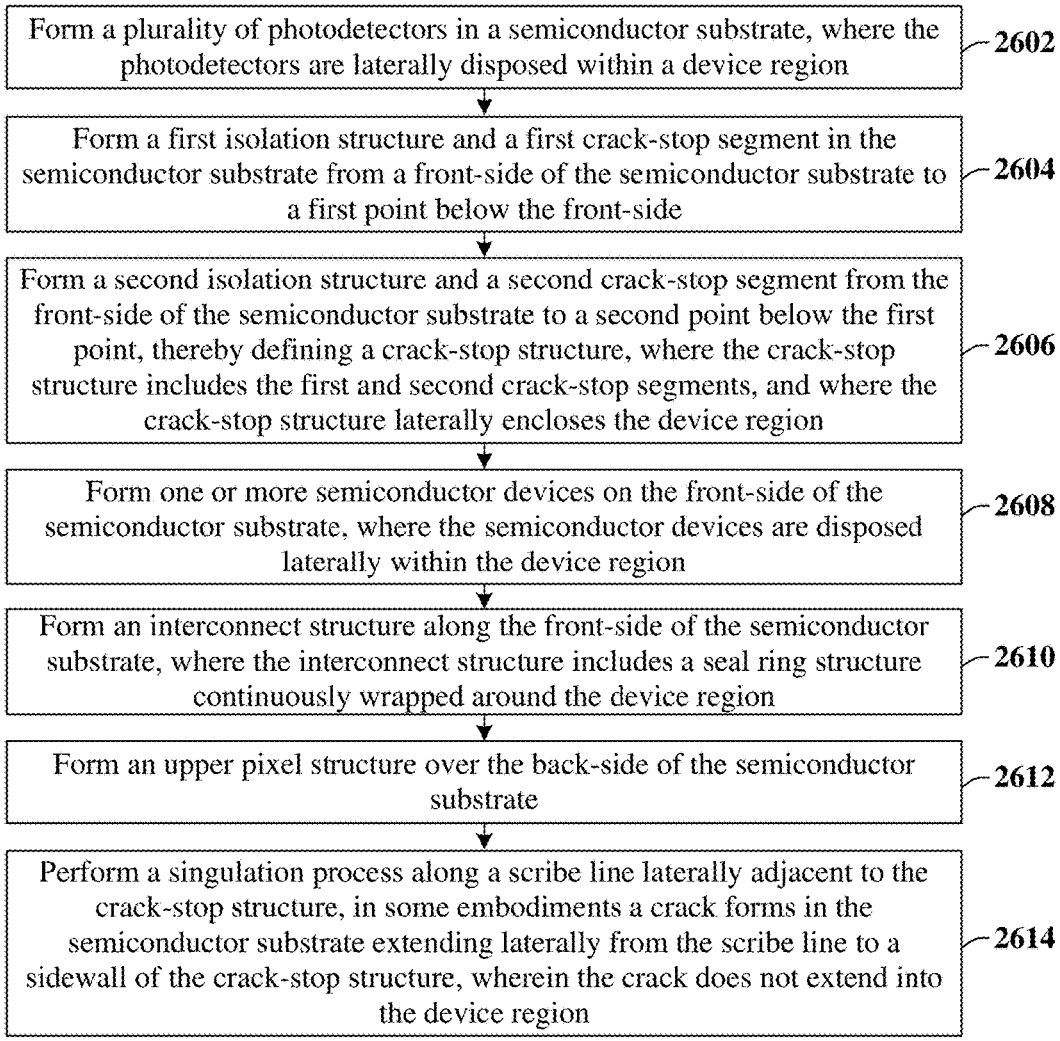
FIG. 26 illustrates a block diagram of some embodiments of the second method of FIGS. 20-25.

FIG. 26 illustrates a second method 2600 for forming an integrated chip having a crack-stop structure laterally surrounding a device region according to the present disclosure. Although the second method 2600 illustrates and/or describes a series of acts or events, it will be appreciated that the second method 2600 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2602, a plurality of photodetectors are formed in a semiconductor substrate. The photodetectors are laterally disposed within a device region. FIG. 20 illustrates a cross-sectional view 2000 corresponding to some embodiments of act 2602.

At act 2604, a first isolation structure and a first crack-stop segment are formed in the semiconductor substrate from a front-side of the semiconductor substrate to a first point below the front-side. FIG. 20 illustrates a cross-sectional view 2000 corresponding to some embodiments of act 2604.

At act 2606, a second isolation structure and a second crack-stop segment are formed from the front-side of the semiconductor substrate to a second point below the first point, thereby defining a crack-stop structure. The crack-stop structure includes the first and second crack-stop segments. The crack-stop structure laterally encloses the device region. FIGS. 21-22 illustrate cross-sectional views 2100-2200 corresponding to some embodiments of act 2606.

At act 2608, one or more semiconductor devices are formed on the front-side of the semiconductor substrate. The one or more semiconductor devices are laterally disposed within the device region. FIG. 22 illustrates a cross-sectional view 2200 corresponding to some embodiments of act 2608.

At act 2610, an interconnect structure is formed along the front-side of the semiconductor substrate. The interconnect structure includes a seal ring structure continuously wrapped around the device region. FIG. 22 illustrates a cross-sectional view 2200 corresponding to some embodiments of act 2610.

At act 2612, an upper pixel structure is formed over the back-side of the semiconductor substrate. FIG. 24 illustrates a cross-sectional view 2400 corresponding to some embodiments of act 2612.

At act 2614, a singulation process is performed along a scribe line that is laterally adjacent to the crack-stop structure. In some embodiments, a crack forms in the semiconductor substrate and extends laterally from the scribe line to a sidewall of the crack-stop structure. The crack does not extend into the device region. FIG. 25 illustrates a cross-sectional view 2500 corresponding to some embodiments of act 2614.

Accordingly, in some embodiments, the present disclosure relates to a semiconductor wafer including a semiconductor substrate. One or more semiconductor devices are disposed within a device region of the semiconductor substrate and a crack-stop structure is disposed within the semiconductor substrate, where the crack-stop structure laterally encloses the device region.

In some embodiments, the present application provides a semiconductor structure including a semiconductor substrate having a back-side surface and a front-side surface opposite the back-side surface; a plurality of photodetectors disposed within the semiconductor substrate and laterally spaced within a device region; an interconnect structure disposed along the front-side surface, wherein the interconnect structure includes a seal ring structure; and a crack-stop structure disposed within the semiconductor substrate and overlying the seal ring structure, wherein the crack-stop structure continuously extends around the device region.

In some embodiments, the present application provides a semiconductor device including a first semiconductor structure including a first substrate and a first interconnect structure overlying the first substrate, wherein the first substrate comprises a first material; a plurality of photodetectors disposed within the first substrate and laterally spaced within a device region; a second semiconductor structure underlying the first semiconductor structure, wherein the second semiconductor structure includes a second substrate and a second interconnect structure overlying the second substrate, and wherein the first interconnect structure and the second interconnect structure contact at a bond interface; a plurality of logic devices disposed on the second substrate and laterally spaced within the device region; a seal ring structure laterally enclosing the device region, wherein the seal ring structure continuously extends from an upper surface of the second substrate to a lower surface of the first substrate; and a first crack-stop structure disposed within the first substrate, wherein the first crack-stop structure laterally encloses the device region, and wherein the first crack-stop structure comprises a second material different from the first material.

In some embodiments, the present application provides a method for forming a semiconductor device, the method includes forming a plurality of photodetectors in a semiconductor substrate, wherein the photodetectors are laterally spaced within a device region, wherein the semiconductor substrate comprises a first material; forming an isolation structure within the semiconductor substrate, such that the isolation structure laterally surrounds the photodetectors; forming a crack-stop structure within the semiconductor substrate, such that the crack-stop structure laterally encloses the device region, wherein the crack-stop structure comprises a second material different from the first material; and forming an interconnect structure over the semiconductor substrate, such that the interconnect structure includes a seal ring structure extending from a top surface of the interconnect structure to a bottom surface of the interconnect structure, wherein the seal ring structure laterally encloses the device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    forming a plurality of photodetectors in a substrate;
    forming a device isolation structure within the substrate, wherein the device isolation structure laterally wraps around the plurality of photodetectors;
    forming an interconnect structure on a front-side surface of the substrate, wherein the interconnect structure comprises a plurality of conductive interconnects within a dielectric structure, wherein the plurality of conductive interconnects comprises a topmost conductive interconnect adjacent to the front-side surface; and
    forming a crack-stop structure within the substrate, wherein the crack-stop structure continuously extends around an outer perimeter of the device isolation structure in a closed path, wherein the device isolation structure and the crack-stop structure comprise a dielectric material, wherein a bottom surface of the crack-stop structure is vertically above a bottom surface of the topmost conductive interconnect.

2. The method of claim 1, wherein the substrate comprises a semiconductor material different than the dielectric material.

3. The method of claim 1,
    wherein the interconnect structure comprises a seal-ring structure, wherein the seal-ring structure laterally wraps around the device isolation structure.

4. The method of claim 3, wherein the crack-stop structure is spaced between opposing sidewalls of the seal-ring structure and directly contacts the crack-stop structure.

5. The method of claim 3, wherein the crack-stop structure is formed after forming the interconnect structure.

6. The method of claim 1, wherein a width of the crack-stop structure discretely changes at least once from a top surface of the crack-stop structure in a direction towards the front-side surface.

7. The method of claim 1, wherein forming the crack-stop structure comprises:
    etching a back-side surface of the substrate to form an opening in the substrate;
    depositing the dielectric material in the opening; and
    performing a planarization process on the dielectric material.

8. The method of claim 1, further comprising:
    performing a singulation process along a scribe line of the substrate, wherein the singulation process cuts through an entire thickness of the substrate and forms a crack within the substrate, wherein the crack continuously extends from the scribe line to a sidewall of the crack-stop structure.

9. A method for forming a semiconductor device, the method comprising:
    forming a plurality of photodetectors in a semiconductor substrate, wherein the photodetectors are laterally spaced within a device region, wherein the semiconductor substrate comprises a first material;

forming an isolation structure within the semiconductor substrate, such that the isolation structure laterally surrounds the photodetectors;

forming a crack-stop structure within the semiconductor substrate, such that the crack-stop structure laterally encloses the device region, wherein the crack-stop structure comprises a second material different from the first material, wherein a bottom surface of the crack-stop structure is vertically aligned with or is vertically above a front-side surface of the semiconductor substrate; and forming an interconnect structure on the front-side surface of the semiconductor substrate, wherein the interconnect structure is formed after forming the plurality of photodetectors and before forming the crack-stop structure.

10. The method of claim 9, wherein forming the crack-stop structure comprises:

etching a back-side of the semiconductor substrate to define a crack-stop opening;

depositing the second material within the crack-stop opening and over the back-side of the semiconductor substrate;

performing a planarization process into the second material until the back-side of the semiconductor substrate is reached, thereby defining the crack-stop structure; and wherein the etching is performed after forming the interconnect structure.

11. The method of claim 9, wherein the isolation structure and the crack-stop structure are formed concurrently with one another.

12. The method of claim 9, further comprising:

performing a thinning process on a back-side surface of the semiconductor substrate after forming the interconnect structure.

13. A method for forming a semiconductor structure, the method comprising:

performing an ion implantation process on a substrate to from a plurality of photodetectors within a device region of the substrate;

forming an isolation structure within the device region and between adjacent photodetectors;

forming an interconnect structure on a front-side surface of the substrate; and performing a thinning process on a back-side surface of the substrate after forming the interconnect structure; and forming a crack-stop structure within the substrate and around the device region, wherein the crack-stop structure comprises a first crack-stop segment disposed on the front-side surface of the substrate and a second crack-stop segment extending from the back-side surface of the substrate to the first crack-stop segment, wherein the first crack-stop segment is formed before forming the interconnect structure and the second crack-stop segment is formed after the thinning process.

14. The method of claim 13, wherein a width of the first crack-stop segment is greater than a width of the second crack-stop segment.

15. The method of claim 13, wherein forming the first crack-stop segment comprises:

etching the front-side surface of the substrate to form a trench extending into the front-side surface; and depositing a dielectric material within the trench.

16. The method of claim 13, wherein forming the second crack-stop segment comprises:

etching the back-side surface of the substrate to form a trench over the first crack-stop segment;

depositing a passivation layer over the substrate and lining the trench; and depositing an upper isolation material over the passivation layer and filling the trench.

17. The method of claim 16, further comprising:

performing a planarization process into the passivation layer and the upper isolation material, wherein a top surface of the passivation layer is co-planar with a top surface of the upper isolation material.

18. The method of claim 1, wherein a height of the crack-stop structure is equal to a height of the device isolation structure, wherein the heights of the crack-stop structure and the device isolation structure are equal to or less than a height of the substrate.

19. The method of claim 1, wherein the crack-stop structure comprises an inner crack-stop structure and an outer crack-stop structure laterally enclosing the inner crack-stop structure, wherein the inner crack-stop structure is laterally offset from the outer crack-stop structure in a direction towards the plurality of photodetectors.

20. The method of claim 1, wherein a width of the crack-stop structure is greater than a width of the device isolation structure.

* * * * *